United States Patent [19]
Leyendecker

[11] Patent Number: 5,867,065
[45] Date of Patent: Feb. 2, 1999

[54] FREQUENCY SELECTIVE PREDISTORTION IN A LINEAR TRANSMITTER

[75] Inventor: Robert Richard Leyendecker, Blaine, Wash.

[73] Assignee: Glenayre Electronics, Inc., Charlotte, N.C.

[21] Appl. No.: 852,390

[22] Filed: May 7, 1997

[51] Int. Cl.⁶ ..................................................... H03F 1/26
[52] U.S. Cl. .......................................... 330/149; 455/126
[58] Field of Search .............................. 330/2, 129, 136, 330/149; 455/126

[56] References Cited

U.S. PATENT DOCUMENTS

| | | | |
|---|---|---|---|
| 5,193,224 | 3/1993 | McNicol et al. | 455/126 |
| 5,732,333 | 3/1998 | Cox et al. | 455/126 |
| 5,748,678 | 5/1998 | Valentine et al. | 330/149 X |

FOREIGN PATENT DOCUMENTS

| | | | |
|---|---|---|---|
| 62-139425 | 6/1987 | Japan | 455/126 |

*Primary Examiner*—Steven Mottola
*Attorney, Agent, or Firm*—Christensen O'Connor Johnson & Kindness PLLC

[57] ABSTRACT

A system for linearly transmitting an amplified output signal using predistortion is disclosed. The system uses a straight inverse modeling scheme to more easily and accurately determine the inverse of the distortion caused by a power amplifier of a RF transmitter. The direct inverse modeling scheme of the present invention indexes the LUT using the modulated input signals instead of the potentially noisier output signals, which helps to increase the accuracy of the predistortion. The predistorter system stores complex coefficients in the LUT, which are then used as the tap weights of a digital filter implementing the predistorter. Finally, the trainer uses a modified version of the power amplifier output signal. The modified power amplifier output signal has the in-band distortion removed from the power amplifier output signal.

21 Claims, 11 Drawing Sheets

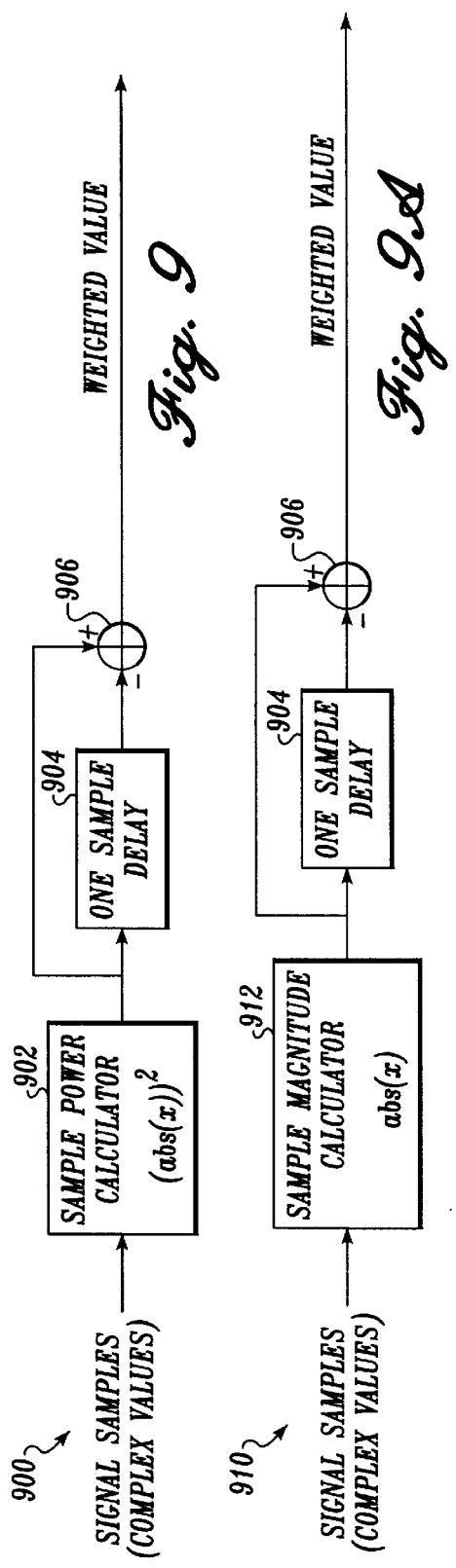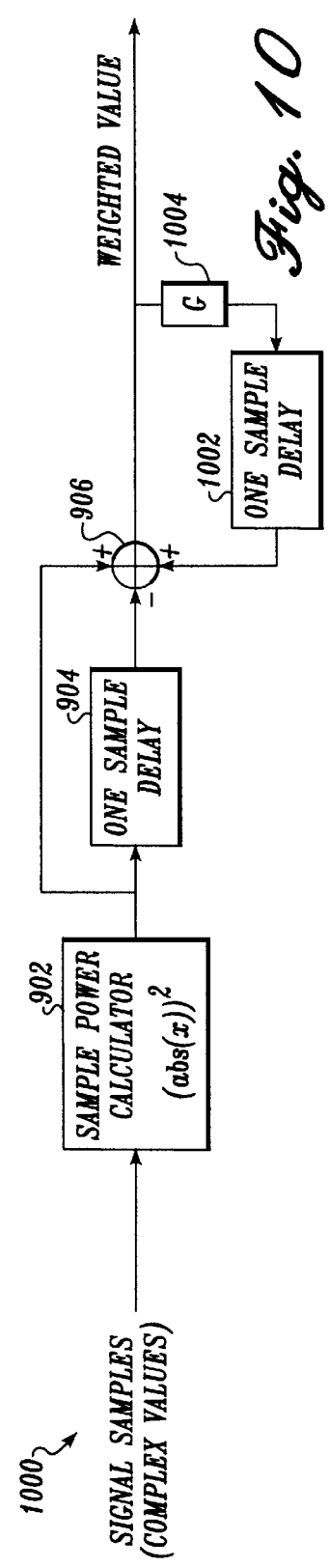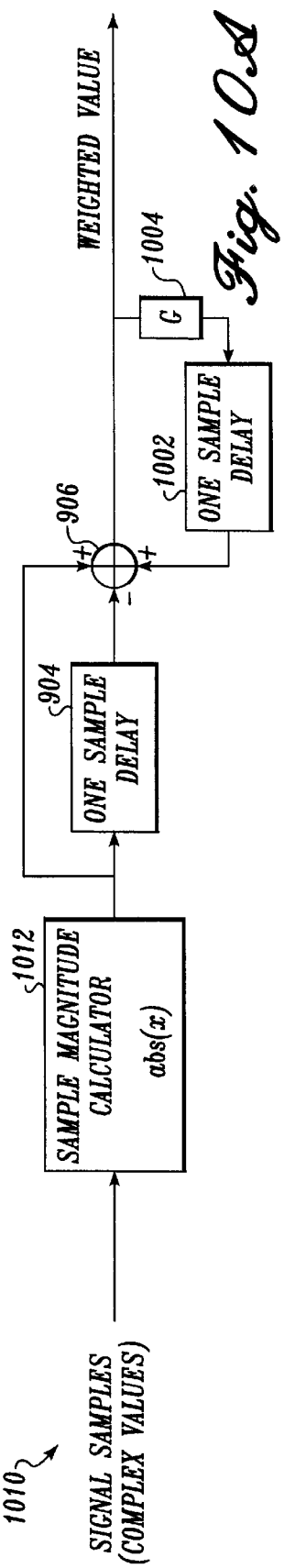

FREQUENCY SELECTIVE PREDISTORTION IN A LINEAR TRANSMITTER

RELATED APPLICATIONS

This application is related to a co-pending application entitled "Method and Apparatus for Linear Transmission By Straight Inverse Modeling" to Leyendecker et al., Ser. No. 08/850,940, filed on May 5, 1997, assigned to the same assignee herein, and expressly incorporated in its entirety by reference herein.

FIELD OF THE INVENTION

The present invention relates to linear transmitters and, more particularly, to linear transmitters using predistortion.

BACKGROUND OF THE INVENTION

It is well-known that the power amplification stages of typical radio frequency (RF) broadcast transmitters behave in a nonlinear fashion when operated near peak capacity. One simple solution to this problem is to "back off" the power amplifier and only operate the power amplifier below saturation in its linear region. However, backing off the power amplifier tends to reduce the power conversion efficiency of the power amplifier. Additionally, for a given required transmitter output power, the power amplifier used must be larger (and more expensive) than a power amplifier that can be operated at peak capacity.

Furthermore, although backing off would allow the power output of the power amplifier to behave more linearly, backing off would not alleviate the phase distortion of the power amplifier. For modulation schemes that only depend upon modulation of amplitude (such as AM), phase distortion is of relatively little concern. However, for other types of modulation schemes that rely upon both amplitude and phase modulation, phase distortion is an important concern.

An alternative solution, commonly referred to as predistortion, compensates for the distortion caused by the power amplifier by "predistorting" the signal to be amplified with the "inverse" of the transfer characteristic of the power amplifier. FIG. 1 is a simplified block diagram of an exemplary conventional predistortion subsystem 100 for use in a transmitter. A predistorter 101 is coupled to receive a modulation signal to be amplified by a power amplifier 103 and broadcast through an antenna 105. The predistorter 101 operates on the received modulation signal to predistort the modulation signal with the calculated inverse of the transfer characteristic of the power amplifier 103. Thus, ideally, the "predistortion" and the power amplifier distortion cancel each other out to achieve a linear amplification of the output signal. In this example, the predistortion subsystem 100 includes a trainer 107 to monitor the power amplifier input and output signals to determine the distortion caused by the power amplifier 103, which may change over time. The trainer 107 then provides signals to update the predistorter 101 so that predistorter 101 tracks any changes in the transfer characteristic of the power amplifier 103.

FIG. 2 is a simplified block diagram of the conventional predistorter 101 (FIG. 1). Typical conventional predistortion schemes attempt to model the performance of the power amplifier and calculate the "inverse" of the amplifier transfer characteristic. All of the predistortion schemes known to the inventors of the present invention attempt to model the power amplifier performance as a function of the instantaneous power or magnitude envelope of the input signal to the power amplifier. Accordingly, these conventional predistortion schemes predistort the input signal as a function of the power or magnitude of the signal to be amplified. For example, U.S. Pat. No. 4,291,277 issued to Davis et al. and U.S. Pat. No. 5,049,832 issued to Cavers disclose such a scheme. Thus, in this scheme, the predistorter 101 includes a power calculator 201 for calculating the instantaneous power or magnitude of the received modulation signal. The calculated instantaneous power or magnitude is then used to access a look-up table (LUT) 203 that stores a corresponding complex value for this particular instantaneous power or magnitude. This complex value approximates the local inverse of the transfer characteristic of the power amplifier for this particular instantaneous power or magnitude of the modulation signal. The LUT 203 can be periodically updated by the trainer 107 (FIG. 1) so that the complex values reflect any changes in the transfer characteristic of the power amplifier 103 (FIG. 1). The LUT 203 provides this complex value to a multiplier 205, which multiplies the modulation signal with this complex value to predistort the modulation signal. Thus, when the predistorted modulation signal is subsequently amplified by the power amplifier, the predistortion cancels to some extent the distortion caused by the power amplifier.

Although these conventional predistortion schemes represent an improvement over earlier schemes to reduce power amplifier distortion, the inventors of the present invention have observed that modeling the power amplifier transfer characteristic using only the instantaneous power or magnitude does not completely accurately predict the distortion caused by the power amplifier. Consequently, predistortion schemes based on such models cannot completely correct the distortion caused by the power amplifier.

FIG. 3 is a flow chart illustrative of a conventional process of calculating the complex values that are stored in the LUT 203 (FIG. 2). In a step 301, the trainer 107 (FIG. 1) determines the instantaneous magnitude and phase of the input signal to the power amplifier 103 (FIG. 1) and the instantaneous magnitude and phase of the amplified (and distorted) output signal. The trainer 107 typically stores these values in a LUT (not shown) within the trainer and, thus, can directly model the transfer characteristics of the power amplifier 103. In step 302, these characteristics are stored in a first lookup table (LUT). This first trainer LUT is indexed using the actual amplifier output power or magnitude. Then in a next step 303, the trainer 107 calculates the mathematical "inverse" of the transfer characteristic of the power amplifier. This step is generally computationally intensive, thereby undesirably increasing the complexity of the hardware and software of the trainer 107 and consuming processing time and power. In addition, because the trainer LUT is indexed by actual amplifier output power or magnitude, addressing errors may occur because the amplifier output signal is potentially noisy. Then in a step 305, the trainer stores the calculated inverse in the second LUT 203 of the predistorter 101.

In view of the above shortcomings of conventional predistortion schemes, there is a need for a predistortion system that will compensate for power amplifier distortion more accurately than the conventional predistortion systems that are based on instantaneous envelope power or magnitude. There is also a need for a less complex and more accurate scheme to provide the inverse of the power amplifier transfer characteristic.

SUMMARY OF THE INVENTION

In accordance with the present invention, a system for linearly transmitting an amplified output signal using predistortion is provided. In one embodiment adapted for use with digital input data, the system uses a straight inverse modeling scheme to more easily and accurately determine the inverse of the distortion caused by a power amplifier of a RF transmitter. In this embodiment, the "inverse" of the power amplifier is directly modeled by considering the power amplifier as a signal processing block with the input and output ports reversed. More specifically, the output signal of the power amplifier is considered the input signal of the "inverse" power amplifier model and, correspondingly, the modulated input signal of the power amplifier is considered the output signal of the "inverse" power amplifier model. As a result, the computationally intensive inversion required by the conventional schemes is avoided, which serves to free up resources and reduce processing time and power consumption. Further, unlike the conventional inverse modeling schemes, the direct inverse modeling scheme of the present invention indexes the LUT using the modulated input signals instead of the potentially noisier output signals, which helps to increase the accuracy of the predistortion. In addition, in one embodiment, the predistorter system stores complex coefficients in the LUT, which are then used as the tap weights of a digital filter implementing the predistorter.

In accordance with other aspects of the present invention, the trainer uses a modified version of the power amplifier output signal. The modified power amplifier output signal has the in-band distortion removed from the power amplifier output signal.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 9 is a block diagram of an envelope filter according to one embodiment of the present invention;

FIG. 9A is a block diagram of an envelope filter according to a second embodiment of the present invention;

FIG. 10 is a block diagram of an envelope filter according to a third embodiment of the present invention;

FIG. 10A is a block diagram of an envelope filter according to a fourth embodiment of the present invention;

DETAILED DESCRIPTION

Figure 1:
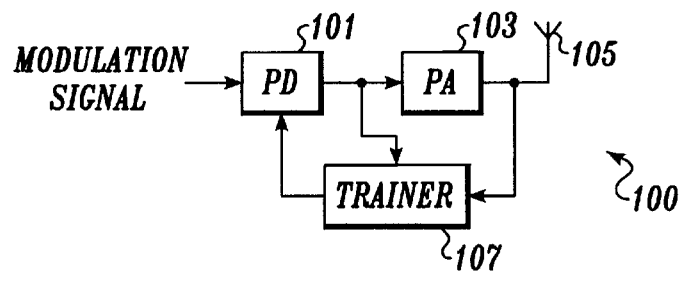
FIG. 1 is a block diagram of a conventional predistortion system.
Figure 2:
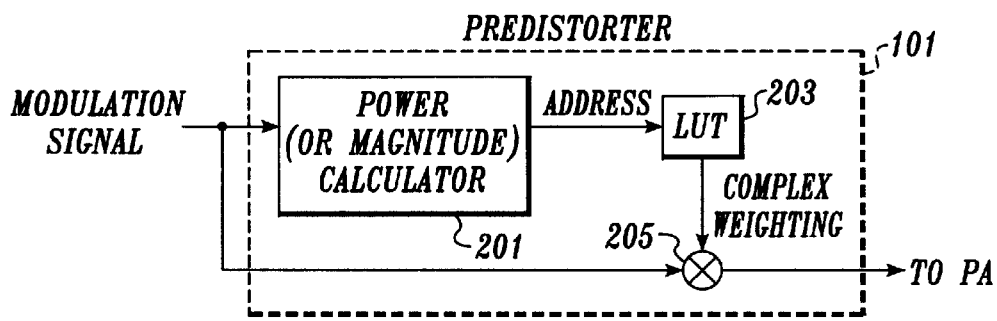
FIG. 2 is a block diagram of a conventional predistorter as depicted in FIG. 1.
Figure 3:
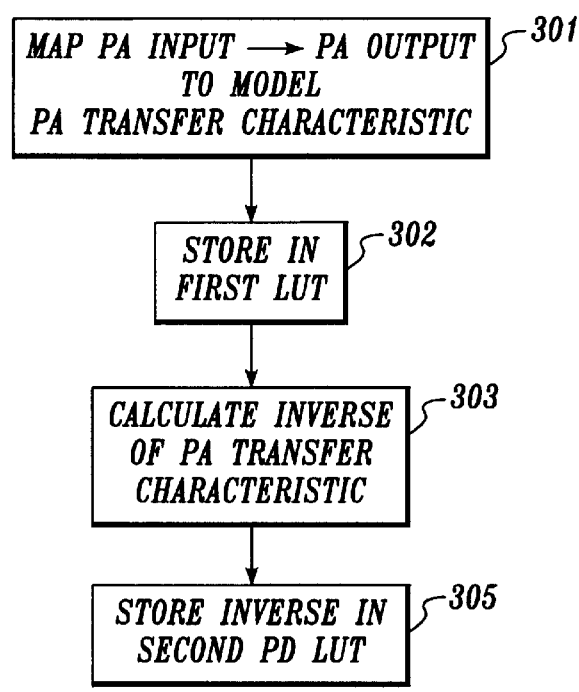
FIG. 3 is a flow diagram of a conventional process to calculate the complex values of the predistorter depicted in FIG. 2.
Figure 4:
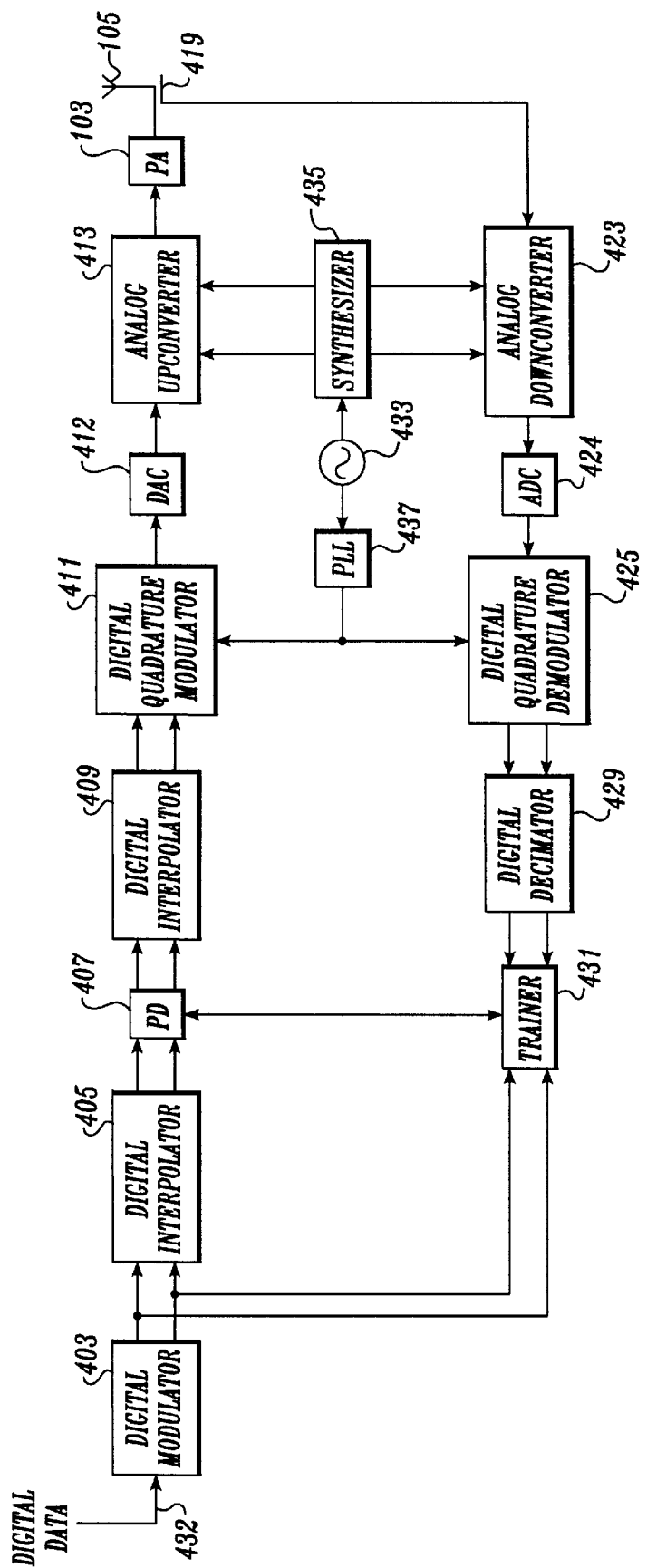
FIG. 4 is a block diagram of a transmitter using a predistortion system according to one embodiment of the present invention.

FIG. 4 is a functional block diagram of a linear transmitter 400 using a predistortion system according to one embodiment of the present invention. This embodiment of the transmitter is substantially similar to the transmitter described in U.S. Pat. No. 5,732,333 to Cox et al., which is commonly assigned to the assignee of the present invention and incorporated herein by reference. In a preferred embodiment, the linear transmitter 400 is adapted for use as a paging transmitter in a paging system, although it can be used in any radio frequency (RF) application.

The transmitter 400, in the forward signal processing path, includes a modulator 403, a predistorter 407, a digital quadrature modulator 411, a digital-to-analog converter 412, an analog upconverter 413, the power amplifier 103 and the transmitting antenna 105. A feedback loop of the transmitter 400 includes a directional coupler 419 (between the power amplifier 103 and the antenna 105), an analog downconverter 423, an analog-to-digital converter 424, a digital quadrature demodulator 425, and a trainer 431. The trainer 431 is coupled to receive the output signals of the digital modulator 403 and interact with the predistorter 407. In other embodiments, additional power amplifiers may be connected in parallel with the power amplifier 103 to increase the gain of the transmitter 400.

Digital data that is to be broadcast by the transmitter 400 is provided to the modulator 403, as represented by an arrow 432. The digital data may be provided by any source. In the preferred embodiment, the digital data received by the modulator 403 is provided from a transmitter controller (not shown) of the paging system. The transmitter controller receives data over a link channel from a paging terminal and formulates the data for transmission. The details of the construction of a transmitter controller, and indeed an entire paging system, can be found in U.S. Pat. No. 5,481,258 to Fawcett et al., U.S. Pat. No. 5,365,569 to Witsaman et al. and U.S. Pat. No. 5,416,808 to Witsaman et al., commonly assigned to the assignee of the present invention and incorporated herein by reference.

In a preferred embodiment, the data is a series of digital symbols, with each symbol representing a predetermined number of bits. The number of bits per symbol is dependent upon the particular modulation scheme being transmitted by the transmitter 400. Modulation formats in typical conventional paging data systems include, for example, two or four tone frequency shift keying (FSK) modulation, continuous phase FSK (CPFSK), 43K75B8E formal modulation (a type of amplitude modulation developed by Motorola) and quadrature amplitude modulation (QAM). QAM formats include, for example, an eight level QAM scheme that would have a three-bit symbol. Similarly, a sixteen level QAM scheme would have four bits per symbol. It will be appreciated that for a three-bit symbol, there are eight possible symbols. Likewise, for a four-bit symbol, there are sixteen possible symbols.

The modulator 403 correlates each particular symbol with predetermined in-phase and quadrature output signals. Thus, for each unique symbol, a different combination of in-phase and quadrature component signals for the base band signal is output by the modulator. In a preferred embodiment, the modulator 403 includes a Texas Instruments TMS320C44 digital signal processor (DSP) microprocessor that is programmed to perform the in-phase and quadrature modulation on the symbols.

Additionally, as each symbol is processed, the modulator 403 does not "instantaneously" transition from one symbol to another. Such an instantaneous change in in-phase and quadrature output signals would result in high frequency harmonics in the system. Instead, by means of digital filtering, a smooth transition between symbols (and therefore in-phase and quadrature output signals) is achieved. One embodiment of this technique which is applicable to an FSK system is disclosed in more detail in U.S. Pat. No. 5,418,818 to Marchetto et al., assigned to the same assignee as the present invention and incorporated herein by reference.

Next, the in-phase and quadrature component signals output by the modulator 403 are input into the predistorter 407. The predistorter 407 is operative to modify the in-phase and quadrature component signals output from the modulator 403 so as to compensate for any distortion that takes place in the power amplifier 103. In accordance with the present invention, the predistorter uses a predistortion scheme that is dependent not only on the instantaneous power or magnitude envelope of the sample, but also on the power or magnitude envelope of the previous samples. By taking into account the power or magnitude envelope of previous samples, the effect of the trajectory leading to the current sample's power or magnitude envelope is also compensated for in the predistortion of the current sample, improving the linearity of the output signal from the power amplifier 103. This predistortion scheme is described further below in conjunction with FIGS. 5–13A.

The output signals of the predistorter 407 are then provided to the digital quadrature modulator 411. The digital quadrature modulator 411 converts the in-phase and quadrature component signals into a single real digital signal. The real digital signal from the digital quadrature modulator 411 is received by a D-A converter 412 that converts the real digital signal to an analog signal, producing an intermediate frequency output signal. For example, the intermediate frequency is approximately 5.6 MHz in a representative embodiment. Because a single D-A converter is used, the distortion caused by the relative delay and amplitude differences introduced in those conventional systems that use separate D-A for in-phase and quadrature signals is substantially eliminated in the transmitter 400.

The intermediate frequency output signal from the D-A converter 412 is provided to the analog upconverter 413, which converts the intermediate frequency signal to a broadcast frequency signal having a frequency within a frequency band of the paging system. For example, the broadcast frequency is approximately 940 MHz in a representative embodiment. The analog upconverter 413 can be any suitable conventional upconverter such as, for example, a mixer receiving a local oscillator signal.

The power amplifier 103 receives the broadcast frequency signal from the analog upconverter 413, amplifies the signal, and provides the amplified signal to the transmitting antenna 105 for transmission. In this embodiment, the power amplifier 103 is substantially similar to the power amplifier disclosed in U.S. Pat. No. 5,694,085 to Walker, assigned to the same assignee as the present invention and incorporated herein by reference. Of course, any suitable power amplifier can be used in other embodiments.

In order to aid in the accurate predistortion of the signal, the feedback loop monitors the amplified signal from the power amplifier 103. The coupler 419 is a conventional directional coupler positioned relatively close to the antenna 105 and is operative to direct a relatively small portion of the output signal from the power amplifier 103 to the analog downconverter 423.

The analog downconverter 423 operates in an opposite manner to the analog upconverter 413. In particular, the analog downconverter 423 lowers the frequency of the receive signal outputted by power amplifier 103 to an intermediate frequency. In a preferred embodiment, this intermediate frequency is substantially the same as the intermediate frequency used in the forward signal processing path. Within the analog downconverter 423, there is a series of filtering, amplification, and mixing with local oscillator signals processes to generate the intermediate frequency signal, as described in the aforementioned U.S. Pat. No. 5,732,333.

Next, the intermediate frequency signal is converted from an analog intermediate frequency signal into a digital signal. This is accomplished by using a conventional A-D converter 424 such as, for example, an Analog Devices AD9026, which samples the intermediate frequency signal and outputs, a digital signal representing the sampled intermediate frequency signal. The digital quadrature demodulator 425 performs a digital quadrature demodulation of the digital signals and outputs the in-phase component signal and the quadrature component signal.

The trainer 431 receives the output signals of the digital quadrature demodulator 425. The trainer 431 also periodically receives the output signals from the modulator 403 and the predistorter 407, as described below in conjunction with FIG. 6. Thus, ideally, the trainer 431 receives the equivalent of the exact modulated signal that was intended to be sent (the output signals of the modulator 403) and the signal that was actually transmitted (the output signals of the digital quadrature demodulator 425). This scheme enables the predistorter 407 to associate the distorted output sample to its corresponding input sample so that the predistorter 407 can more accurately compensate for the distortion caused by the power amplifier 103. Typically, the trainer provides one or more "trainer" signals to the predistorter to update the predistorter's response to the in-phase and quadrature signals input to the predistorter as the power amplifier's response changes due to temperature, age, etc.

In addition, the trainer monitors the actual data or voice signals being transmitted to implement the predistortion scheme, as opposed to special sequences (i.e., not normal data or voice signals) as required by some conventional systems. Thus, normal data or voice transmissions need not be interrupted to transmit special data sequences to update the predistorter as in these conventional systems.

In a further refinement, the transmitter 400 may include digital interpolators 405 and 409, and a digital decimator 429. The digital interpolator 405 is connected between the modulator 403 and the predistorter 407, the digital interpolator 409 is connected between the predistorter 407 and the digital quadrature modulator 411, and the digital decimator 429 is connected between the digital quadrature demodulator 425 and the trainer 431. This circuitry provides further upconversion in the forward signal processing path and corresponding downconversion in the feedback path.

In addition, the transmitter 400 includes a synthesizer 435 connected to the analog upconverter 413 and the analog downconverter 423, a phase locked loop (PLL) 437 connected to the digital quadrature modulator 411. An ovenized reference oscillator 433 is connected to both the synthesizer 435 and the PLL 437. This timing circuitry ensures that the modulation, upconversion, downconversion and demodulation are accurately synchronized.

In this embodiment, the output signals of the modulator 403 are the in-phase and quadrature component signals sampled at 80,000 samples per second (80 ksps). The in-phase and quadrature component signals output by the modulator 403 are received by the digital interpolator 405. The digital interpolator 405 operates to increase the effective sampling rate of the received signals by means of digital interpolation. In a preferred embodiment, the digital interpolator 405 outputs the in-phase and quadrature component signals at a rate of approximately 800 ksps and is implemented with a DSP module having a TMS320C44 DSP microprocessor and associated memory, as described below in conjunction with FIG. 14.

The signals output by the interpolator 405 are received by the predistorter 407. The predistorter 407, as previously described, predistorts the received in-phase and quadrature component signals to compensate for the distortion of the power amplifier 103. The predistorted 800 ksps component signals from the predistorter 407 are received by the digital interpolator 409. The digital interpolator 409 operates in a fashion similar to the interpolator 405 to increase the effective sampling rate. Specifically, both the in-phase and quadrature component signals are first upconverted in a first step by a factor of two. Thus, after this first conversion, the effective sampling rate of the component signals is approximately 1.6 Msps. The signals are then upconverted by another factor of two, resulting in an effective rate of approximately 3.2 Msps. Next, these two 3.2 Msps signals are passed to a further interpolator which upconverts them by a factor of seven to approximately 22.4 Msps. Thus, the output signals of the digital interpolator 409 are in-phase and quadrature component signals that have been sampled at 22.4 Msps. The interpolation stages include digital filtering of the base band signals. The implementation of the digital interpolator 409 is described in more detail in the aforementioned U.S. Pat. No. 5,732.333.

The digital quadrature modulator 411 receives the output signals of the digital interpolator 409 and modulates them as previously described using a digital quadrature modulation scheme. In this embodiment, the digital quadrature modulator 411 uses a digital equivalent of a conventional double balanced modulation scheme in conjunction with a 5.6 MHz carrier signal derived from a 22.4 MHz signal provided by the PLL 437. The real digital modulated output signal is then converted to an analog signal by the D-A converter 412. As a result, the D-A converter 412 outputs a 5.6 MHz analog intermediate frequency signal to the analog upconverter 413.

The analog upconverter 413 receives two local oscillator signals provided by the synthesizer 435. In a preferred embodiment in which the broadcast frequency is 940 MHz, the two frequencies provided by the synthesizer 435 are a 36.9 MHz local oscillator signal and a 897.5 MHz local oscillator signal. The analog upconverter 413 receives the local oscillator signals for mixing with the 5.6 MHz intermediate frequency signal in a conventional two-stage mixing scheme. In the first stage of the upconversion, the intermediate signal is mixed with the 36.9 MHz local oscillator signal, and the upper side band of the resulting 42.5 MHz signal is amplified and bandpass filtered before being mixed with the 897.5 MHz local oscillator signal. The resulting upper side band at 940 MHz is bandpass filtered and provided to the power amplifier 103. It will be appreciated by those skilled in the art of linear RF transmitters that to change the frequency of transmission of the transmitter 400, the local oscillator frequencies generated by the synthesizer 435 can be changed. The 940 MHz signal is then amplified by the power amplifier 103 and broadcast through antenna 105 as previously described for transmitter 400.

In a preferred embodiment, the synthesizer 435 is a Phillips SA7025 synthesizer chip. As noted above, the synthesizer 435 controls the variable local oscillator signal for precisely determining the transmit frequency of the signal. The synthesizer 435 uses a reference oscillator 433 that, in a preferred embodiment, is a stable reference at 10 MHz. In this preferred embodiment, this 10 MHz stable reference is obtained from the transmitter controller of a paging base station.

The 940 MHz receive signal from the coupler 419 is provided to the analog downconverter 423, converted to the intermediate frequency of 5.6 MHz, and received by the digital quadrature demodulator 425. The digital quadrature demodulator 425 operates to generate in-phase and quadrature component signals at 22.4 Msps. In a preferred embodiment, the digital quadrature demodulator is implemented using a Xilinx 4003 field programmable gate array (FPGA) that has been configured to perform the digital quadrature demodulation.

The digital decimator 429 receives the output signals of the digital quadrature demodulator 425 and performs a decimation by a factor of twenty-eight to produce 800 ksps complex base band signals. The downconversion is performed, in a preferred embodiment, by two Harris HSP43220 decimating filter chips programmed to decimate by twenty-eight and to filter the base band signals.

The 800 ksps complex base band signals are received by the trainer 431. As previously described, the trainer analyzes the receive signals and the signals from the modulator 403 to control the predistorter 407 to properly compensate for the distortion caused by the power amplifier 103.

Another important feature of the present invention is that all of the processing done by each of the components of FIG. 4 is keyed off synchronous clock signals. By utilizing the same clocking in the demodulation scheme of components 424–429 as is used in the modulation scheme of components 403–412 and trainer 429, it is possible to monitor the transmitted signal quality on each digital sample. The modulation and demodulation are phase locked to one another with adjustment only needed for the delay through the analog and digital stages, including the power amplifier 103.

Figure 5:
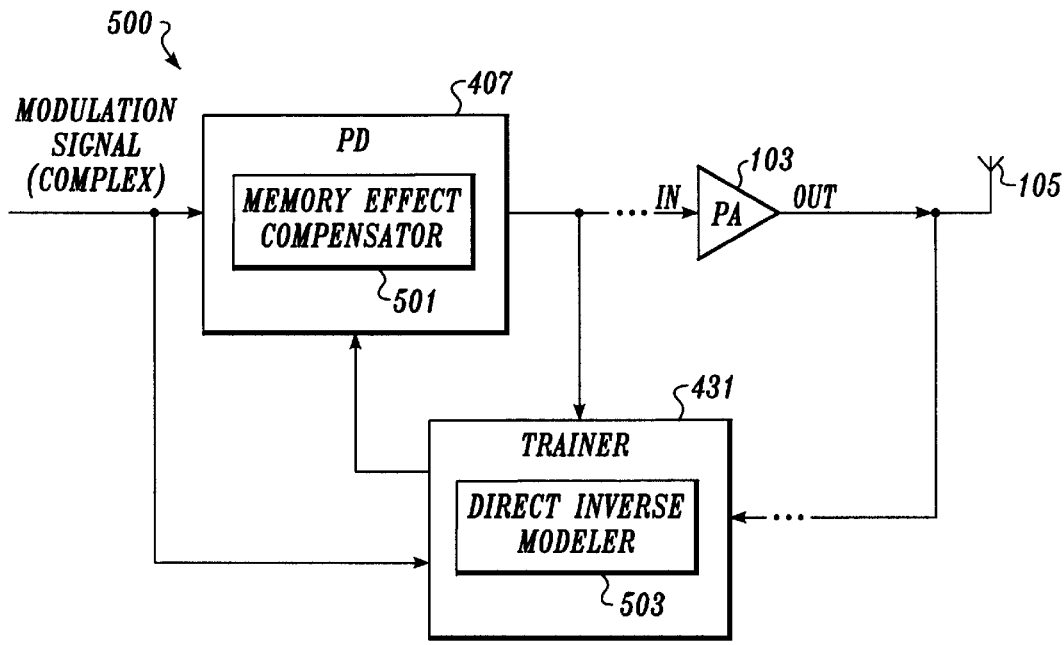
FIG. 5 is a block diagram of a predistortion system according to one embodiment of the present invention.

FIG. 5 is a functional block diagram of a predistortion system 500 according to one embodiment of the present invention, with the intervening circuitry omitted for clarity. The predistortion system 500 includes the predistorter 407, the power amplifier 103 and the trainer 431. In addition, the predistorter 407 and trainer 431 respectively include a memory effect compensator 501 (described further below in conjunction with FIGS. 6–8) and a direct inverse modeller 503 (described farther below in conjunction with FIGS. 5A and 5B).

As described above in conjunction with FIG. 4, the predistorter 407 receives digital input samples and modifies them with, ideally, the inverse of the transfer characteristic of the power amplifier 103. In particular, the predistorter 407 determines the instantaneous power or magnitude envelope of the current sample, with the predistortion being determined as a function of this instantaneous value. However, unlike other predistortion systems, the memory effect compensator 501 of the predistorter 407 takes into account the power or magnitude envelope of one or more previous samples. More specifically, the inventors of the present invention have observed that modeling the power amplifier transfer characteristic using only the instantaneous power or magnitude does not completely accurately predict the distortion caused by the power amplifier 103. Further, the inventors of the present invention have observed that the power amplifier's transfer characteristic also depends on past power or magnitude envelopes, which is referred to herein as a "memory effect" of the power amplifier 103. The memory effect of the power amplifier is related to the power or magnitude trajectory of the previous power or magnitude envelopes leading to the instantaneous power or magnitude envelope of the current sample. This memory effect is believed to be a heretofore unappreciated factor in the distortion caused by the power amplifier. By determining the predistortion for each sample as a function of both the instantaneous power or magnitude envelope and past power or magnitude envelopes, the accuracy of the predistortion can be improved. Implementations of the predistorter 407 with memory effect compensator 501 are described below in conjunction with FIGS. 7 and 8.

As described above, the trainer 431 receives the power amplifier output signals after appropriate downconversion and analog-to-digital conversion and determines the inverse of the power amplifier transfer characteristic. The trainer 431 also receives the digital sample of the modulation signal. Because the timing and sampling is synchronized, the trainer 431 matches (by taking into account the delay through the intervening circuitry) the input digital sample with the corresponding sample of the power amplifier output signal. Thus, the trainer 431 models the inverse of the power amplifier transfer characteristic on a sample-by-sample basis. The trainer 431 then "qualifies" this "inverse" data so that the trainer only trains on valid data. This qualifying process is described below in conjunction with FIGS. 13–13A. The trainer 431 then updates the predistorter 407 with qualifying inverses of the power amplifier transfer characteristic.

Figure 5A:
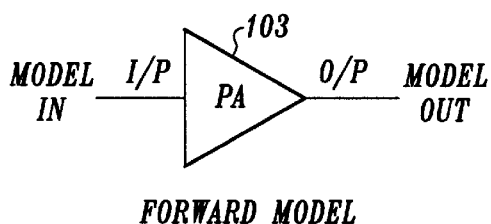
FIG. 5A and FIG. 5B are block diagrams illustrating direct inverse modeling according to one embodiment of the present invention.
Figure 5B:
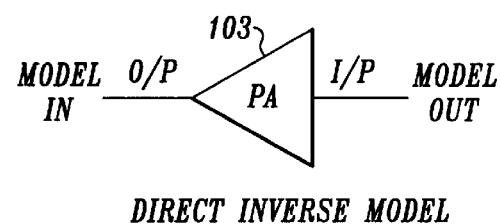

In order to reduce processing time, power dissipation and hardware, the trainer 431 includes the direct inverse modeller 503. The block diagrams of FIGS. 5A and 5B illustrate the concept of direct inverse modeling. The inverse of the power amplifier transfer characteristic is modeled as a non-linear "filter" with the input and output leads interchanged. That is, the output signal of, the power amplifier is considered the input to the non-linear "filter", whereas the input signal of the power amplifier is considered the output of the non-linear "filter", as shown in FIG. 5A. The complex "gain" as determined from the output lead of the power amplifier to the input lead of the power amplifier represents the "inverse" characteristic that the predistorter should multiply with the complex modulation signal sample before amplification by the power amplifier. Consequently, instead of building a forward model of the power amplifier transfer characteristic (e.g. FIG. 5B) and then mathematically calculating the inverse, the trainer updates the predistorter with the "output sample-to-input sample" gain and phase of the power amplifier, indexed by the instantaneous power or magnitude of the modulation signal sample. Thus, the computationally intensive mathematical inversion process is avoided, enabling the trainer to calculate the inverse characteristic of the power amplifier at a relatively high sample rate in real time. In addition, unlike the other predistortion schemes that index the inverse characteristic using the power amplifier output samples, the trainer 431 indexes the inverse characteristic using the modulation signal samples. The modulation signal samples are typically much less noisy than the power amplifier output samples, resulting in a more accurate predistortion by the predistorter 407.

Figure 6:
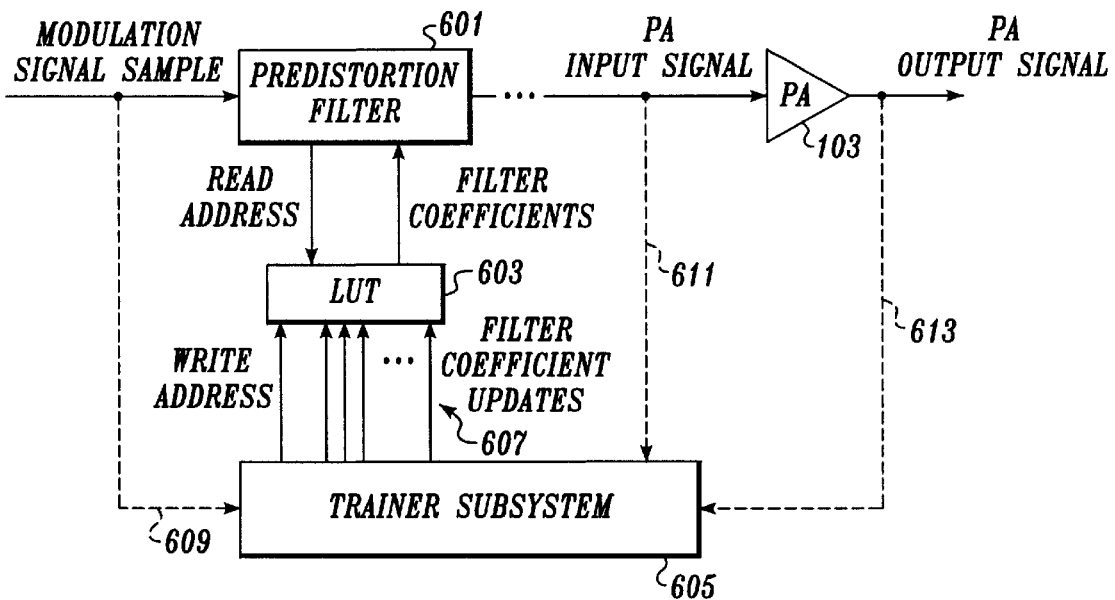
FIG. 6 is a more detailed block diagram of the predistortion system depicted in FIG. 5.

FIG. 6 is a more detailed functional block diagram of the predistortion system 500 depicted in FIG. 5. The predistorter 407 of this embodiment is implemented with a predistortion filter 601 and a LUT 603. The predistortion filter 601 is implemented using a digital filter circuit (see FIG. 7), with the filter coefficients or taps of the digital filter circuit being stored in the LUT 603. The predistortion filter 601 provides the predistortion functionality as a function of both the instantaneous power or magnitude envelope of the current modulation signal sample and the power or magnitude envelopes of previous modulation signal samples. The trainer subsystem 605 (i.e., the trainer and circuitry for sampling, downconverting and digitizing the power amplifier output signal) periodically updates the inverse characteristics of the power amplifier 103 by providing a write address and updated filter coefficients to the LUT 603, as shown by the lines 607. In addition, the trainer subsystem 605 periodically receives "batches" of data containing the modulation signal samples, power amplifier input signal samples and power amplifier output signal samples as indicated by the lines 609, 611 and 613, respectively. The trainer subsystem 605 provides the inverse characteristics of the power amplifier to the LUT 603 as described below in conjunction with FIGS. 12–13A.

Figure 7:
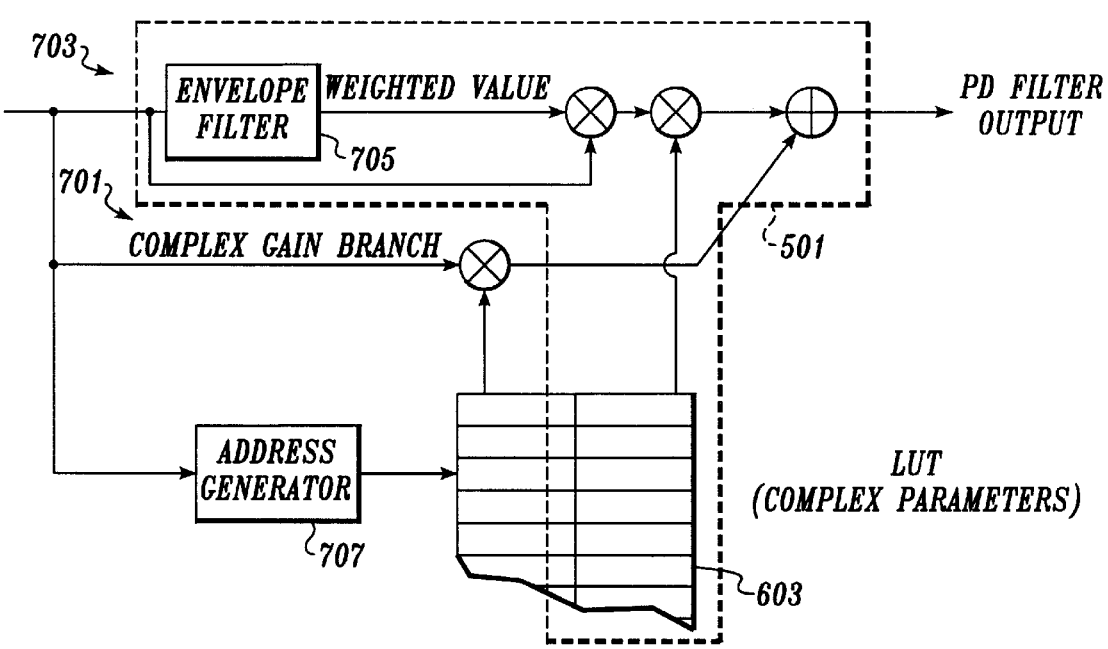
FIG. 7 is a block diagram of a predistortion filter according to one embodiment of the present invention.

FIG. 7 is a functional block diagram of the predistortion filter 601 according to one embodiment of the present invention. The predistortion filter 601 includes a complex gain (or static) branch 701, and a parallel weighted branch 703 that implements the functionality of the memory effect compensator 501 (FIG. 5). The output signals of these branches are then summed to produce the filter output signal. This filter output signal is the predistorted signal serving as a basis (i.e., before upconversion and D/A conversion) for the input signal received by the power amplifier (see FIG. 4). Because the filter output signal is digital, the filter output signals are also referred to herein as the filter output samples. In this embodiment, the predistortion filter 601 is implemented with a TMS320C44 DSP microprocessor and associated memory (not shown) using techniques well known in the art of digital linear transmitters. The predistortion filter 601 also includes an address generator 707 that is used to generate the read addresses to access the LUT 603. The address generator 707 is described below in conjunction with FIG. 11.

The static branch 701 multiplies the modulation signal sample by a complex parameter from the LUT 603. The address generator 707 uses the instantaneous power or magnitude envelope of the current modulation signal sample to generate the address of this complex parameter. The complex parameter represents part of the "inverse" characteristic to be multiplied with the current modulation signal sample.

The weighted branch 703 includes an envelope filter 705, which generates weighted values as a function of previous power or magnitude envelope samples. The envelope filter 705 is described further below in conjunction with FIGS. 9 and 10. In this embodiment, the envelope filter 705 generates the weighted values as a function of the current and the previous modulation signal sample, using a first order digital filter to model the memory effects of the power amplifier. The scalar weighted values are then multiplied by the complex input samples. The resulting signal is multiplied by the complex parameters stored in the LUT 603. In this embodiment, the LUT 603 is indexed by the instantaneous power or magnitude of the modulation samples to provide the appropriate complex parameter for the weighted branch 703, which is calculated by the address generator 707. This first order modeling of the memory effect is relatively simple to implement while achieving accuracy which is significantly better than from complex gain alone. In other embodiments, higher order digital filters may be used to model the memory effects of the power amplifier. In addition, in other embodiments, the LUT 603 may include additional dimensions or tables that are indexed by other pertinent parameters. For example, LUT tables may be addressed by both instantaneous power or magnitude and also by an average of envelope power or magnitude of previous samples. In addition, different tables may be used for different modulation schemes or during ramp up or ramp down of power to the power amplifier. Of course, adding additional tables tends to increase the memory requirements, processing time and power dissipation of the predistortion system. However, increased DSP microprocessor and memory device performance may make these systems easier to implement in the future.

Figure 8:
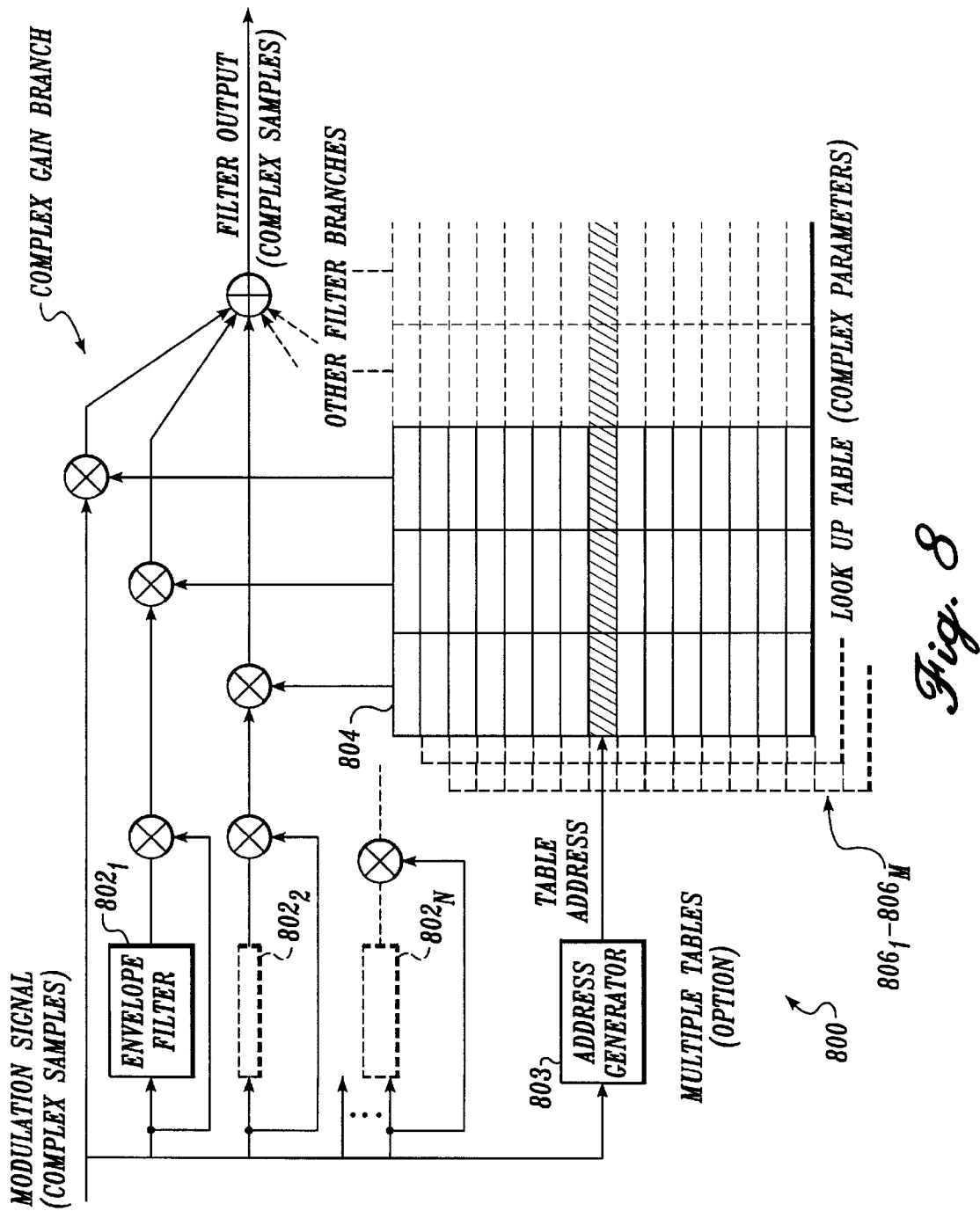
FIG. 8 is block diagram of a predistortion filter according to a second embodiment of the present invention.

FIG. 8 is a functional block diagram of a predistortion filter 800 having additional indexes compared to the predistortion filter 603 (FIG. 7), according to another embodiment of the present invention. In this embodiment, the predistortion filter 800 has multiple envelope filters 802$_1$–802$_N$, an address generator 803 and a LUT 804. The LUT 804 has a column associated with each envelope filter, which are indexed by the address generator 803 as a function of the instantaneous power or magnitude envelope of the current modulation signal sample and power or magnitude envelopes of past modulation signal samples. The address generator 803 is described further below in conjunction with FIG. 11.

In addition, optional LUTs 806$_1$–806$_M$ can be included to implement a multi-table predistortion filter as described above in conjunction with FIG. 7. The predistortion filter 800 operates in a substantially similar manner as the predistortion filter 603 (FIG. 7), with the additional envelope filters providing additional weighted branches to account for other memory effects. For example, the envelope filters 802$_1$–802$_N$ may correspond to actual past power or magnitude envelope samples rather than the average of past power or magnitude envelope samples as in the predistorter 603 (FIG. 7). The envelope filters may also correspond to different filtered averages of past sample power or magnitude.

FIG. 9 is a functional block diagram of an envelope filter 900 implemented with a finite impulse response (FIR) digital filter, according to one embodiment of the present invention. The envelope filter 900 includes a sample power calculator 902, a delay circuit 904 and an adder 906. The delay circuit 904 and adder 906 form a FIR digital filter. In particular, the sample power calculator 902 provides a signal representing the power of the current modulation signal sample to the delay circuit 904 and the adder 906. The delay circuit 904 then provides the power of the previous modulation signal sample to the adder 906, which subtracts this previous modulation sample power from the current modulation signal power to generate the output signal of the envelope filter. The sample power calculator 902 and the FIR filter are implemented by the TMS320C44 DSP microprocessor and associated memory (not shown) using techniques well known in the art of digital linear transmitters.

FIG. 9A illustrates an envelope filter 910 similar to that in FIG. 9 but in which the sample power calculator is replaced by a sample magnitude calculator 912.

FIG. 10 is a functional block diagram of an envelope filter 1000 implemented with an infinite impulse response (IIR) digital filter, according to another embodiment of the present invention. The envelope filter 1000 includes the sample power calculator 902, the delay circuit 904, the adder 906, a second delay circuit 1002 and a gain block 1004. The delay circuit 904, adder 906, delay circuit 1002 and gain block 1004 form an IIR digital filter. In particular, the sample power calculator 902 provides a signal representing the power of the current modulation signal sample to the delay circuit 904 and the adder 906. The delay circuit 904 then provides the power of the previous modulation signal sample to the adder 906. The adder 906 also receives a scaled version of the previous output sample of the envelope filter from the delay circuit 1002 and the gain block 1004. To ensure stability of the IIR digital filter, the gain block 1004 scales each output sample before the output sample is stored in the delay circuit 1002. The adder 906 then subtracts this previous modulation sample power from the sum of the current modulation signal power and the previous envelope filter output sample to generate the output signal of the envelope filter. The sample power calculator 902 and the IIR filter are implemented by the TMS320C44 DSP microprocessor and associated memory (not shown) using techniques well known in the art of digital linear transmitters.

FIG. 10A illustrates an envelope filter block 1010 similar to that in FIG. 10 but in which the sample power calculator is replaced by a sample magnitude calculator 1012.

Figure 11:
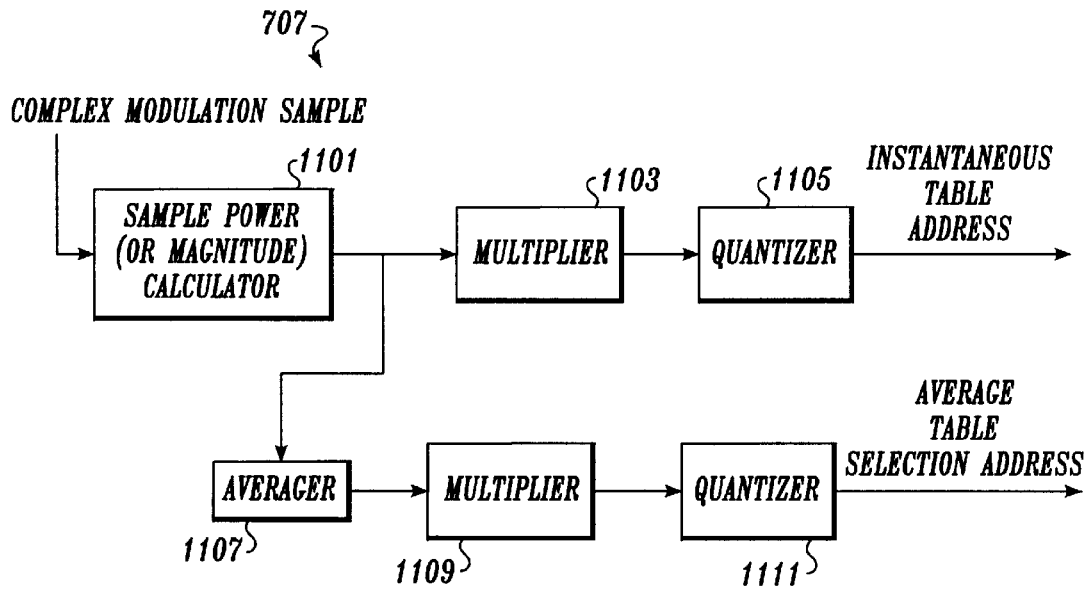
FIG. 11 is a functional block diagram of a look-up table address generator according to one embodiment of the present invention.

FIG. 11 is a functional block diagram of the address generator 707 of the predistortion filter 601 (FIG. 7), according to one embodiment of the present invention. The address generator 707 has a sample power calculator 1101, multipliers 1103 and 1109, quantizers 1105 and 1111, and an averager 1107. The sample power calculator 1101 receives the current modulation signal sample and outputs a signal representing the magnitude of the instantaneous power envelope of the current modulation signal sample. Alternatively, a sample magnitude calculator may be used instead of the sample power calculator 1101 in other embodiments in which the predistortion scheme is based on the magnitude of the modulation signal instead of power. The aforementioned TMS320C44 DSP microprocessor (not shown) implementing the predistortion filter 601 is programmed to calculate the power or magnitude from the digital modulation signal samples.

The instantaneous power or magnitude sample from the sample power (or magnitude) calculator 1101 is received by the multiplier 1103, which then scales the instantaneous power or magnitude sample by a constant in order to match the range of table memory addresses. The scaled instantaneous power or magnitude sample is then quantized by the quantizer 1105. This quantized value serves as the table address for the LUT 603 (FIG. 7), which stores the values describing the complex inverse characteristic for the branches of the predistortion filter.

In addition, the instantaneous power or magnitude sample from the sample power (or magnitude) calculator 1101 is received by the averager 1107. In this embodiment, the averager 1107 calculates the mean of the instantaneous power or magnitude samples of the current and one or more previous power or magnitude samples. This simple scheme provides a relatively good indication of the trajectory of the instantaneous power or magnitude envelope of the current power or magnitude sample without requiring a relatively large amount of processing time, memory and hardware. Of course, in other embodiments, the average may be calculated using different schemes. For example, the average may be calculated from a different number of previous power or magnitude samples, or by using a weighted averaging scheme that gives less weight for the oldest power or magnitude samples. Then, the multiplier 1109 and quantizer 1111 provide the table address for the selection of alternative tables $806_1$–$806_M$ (FIG. 8) as described above for the multiplier 1103 and quantizer 1105.

In a further refinement of multi-table embodiments (e.g., see LUTs $806_1$–$806_M$ in FIG. 8), the address generator can also receive control signals from the transmitter controller (not shown) indicative of the current modulation format (e.g., FSK, QAM, etc.) and whether the transmitter is ramping up or down in power at the start or finish of a transmission. As described in conjunction with FIG. 4, the transmitter controller provides the modulation signal samples to the modulator 403. In light of this disclosure, those skilled in the art of digital transmitters can adapt the transmitter controller to provide these control signals without undue experimentation. In response to these control signals, the address generator then selects the LUT corresponding to the current combination of modulation format and state of the transmitter.

Figure 12:
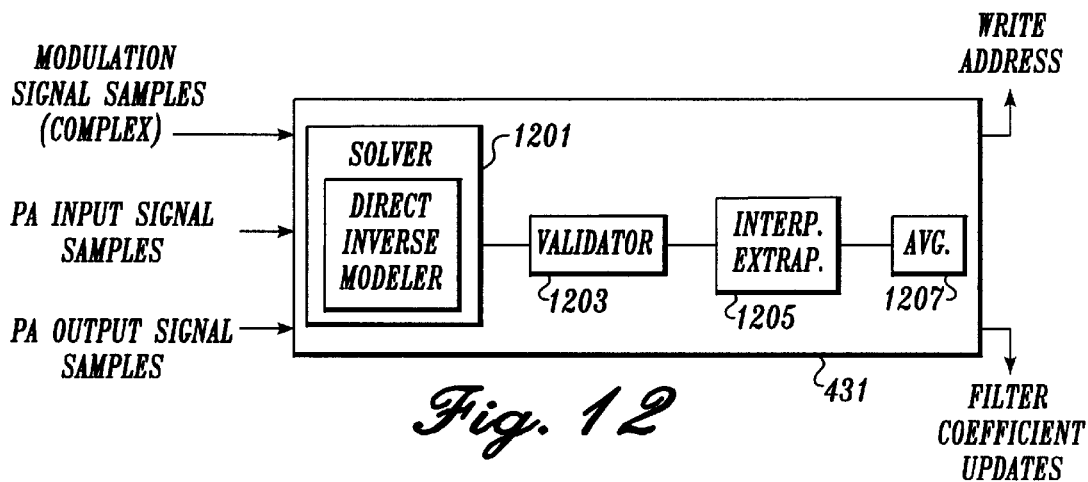
FIGS. 12, 12A and 12B are functional block diagrams of a trainer according to different embodiments of the present invention.

FIG. 12 is a functional block diagram of the trainer 431 (FIG. 5), which includes a solver 1201, a validator 1203, an interpolator/extrapolator 1205 and an averager 1207, according to one embodiment of the present invention. The solver 1201 also includes the functionality of the direct inverse modeller 503. The trainer 431, including the solver 1201, is implemented with a TMS320C44 DSP microprocessor and associated memory, to function as follows. The trainer 431 receives and stores the modulation signal samples from the transmitter controller (not shown).

The trainer 431 also receives and stores from the digital decimator 429 (FIG. 4) complex digital signals that are scaled down, downconverted and digitized samples of the power amplifier output signals. These signals are referred to herein as the $PA_{out}$ samples.

In addition, the trainer receives and stores complex digital signal samples corresponding to the power amplifier input signals. In a preferred embodiment, the trainer 431 generates these power amplifier input signals by duplicating the predistorter functionality to generate the same input signals (prior to interpolation, upconversion and D/A conversion) that were received by the power amplifier. These signals are referred to herein as the $PA_{in}$ samples. This embodiment is advantageously used to reduce the interconnection required to the trainer 431. Of course, in other embodiments, the trainer 431 may have an input port coupled to the output port of the predistorter to receive the PAI samples directly from the predistorter. The trainer 431 then provides the proper delays and synchronization to match the $PA_{in}$ samples and $PA_{out}$ samples with the originating modulation signal samples.

The solver 1201 then periodically processes a "batch" or "block" of this stored data to generate the complex parameters used to update the LUT of the predistorter. In particular, the trainer uses the instantaneous power or magnitude of the modulation signal samples to generate the write addresses of the predistorter LUT at which the trainer stores the complex inverse characteristics obtained by the direct inverse modeller 503 (i.e., indexing the LUT using the modulation signal samples). The write addresses are obtained in the same way as the read addresses as described with respect to FIG. 11.

In one embodiment of the solver 1201, it first performs interpolation to increase the number and time resolution of the samples used in the training. In one embodiment, this interpolation is used to achieve, in effect, a 48M samples/second sampling rate. This interpolation has been found to improve the linearization of the transmitter output signals. The trainer 431 then quantizes the samples into "bins" that are equal in number to the number of table addresses in the predistorter LUT. In the preferred embodiment, the validator 1203 checks that there are enough data samples in a bin and that their distribution is statistically significant (i.e., not too much variation). If the values associated with a bin are qualified by the validator 1203, then the average of these values is calculated to derive a new complex parameter value for each bin. For example, in one embodiment, a least squares method is used to determine an average value of the complex parameter for each bin. The calculated values for each bin can then be used to update the predistorter LUT. In a further refinement, each calculated parameter can be averaged or filtered with the corresponding previously trained parameters (or, alternatively, a weighted average of previously trained parameters) to generate the updated parameter. This averaging is used to smooth out changes in the parameter and to get a better parameter estimate. This value can then be used to update the predistorter LUT.

In the qualification process, the validator 1203 checks each parameter value to determine whether each parameter value is reliable. Each reliable parameter is then stored at the corresponding address of the predistorter's LUT (i.e., at the address defined by the address generator for the quantized modulation signal sample). In addition, any parameters calculated for bins having a number of samples below a predetermined threshold are discarded, resulting in empty bins. The interpolator/extrapolator 1205 then determines the parameters of the empty bins (if any) by interpolation or extrapolation from the other surrounding bins. Then the averager 1207 averages each calculated parameter with the corresponding parameter currently stored in the predistorter LUT. When averaging a calculated parameter with the corresponding current parameter in the predistorter LUT, the trainer reads the contents of the predistorter LUT into the trainer. Similarly, when averaging a calculated parameter with a weighted average of past parameters, the trainer may include a memory array storing the running weighted average. These averaged values are then used to update the predistorter LUT. In this embodiment, the solver, validator, interpolation/extrapolation and averaging functions are implemented in the TMS320C44 DSP microprocessor and associated memory (not shown) using techniques well known in the art of digital linear transmitters. The operation of the trainer 431 is described further below in conjunction with FIGS. 13 and 13A.

It will be appreciated that parameters stored in the predistorter's LUT will have a pair of complex values for each address, one for each column of the LUT (e.g., see LUT 603 in FIG. 7). One of these values corresponds to the complex parameter to be multiplied with the complex gain (static) branch of the modulation signal sample, and the other value corresponds to the complex parameter to be multiplied with the weighted branch of the modulation signal sample.

Figure 12A:
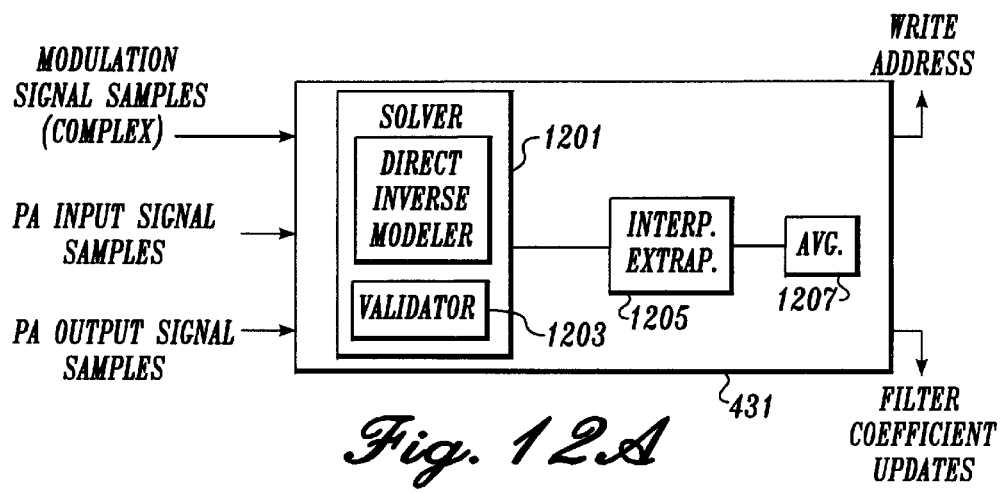

FIG. 12A is a functional block diagram of the trainer 431 (FIG. 5), according to another embodiment of the present invention. This embodiment is substantially similar to the embodiment of FIG. 12, except that the validator 1203 is part of the solver 1201. This embodiment can be advantageously used to qualify data before the parameter calculations are completed. Thus, when the validator 1203 detects unreliable data for a particular bin, the bin can be immediately emptied and the calculations for that bin terminated to reduce processing time.

Figure 12B:
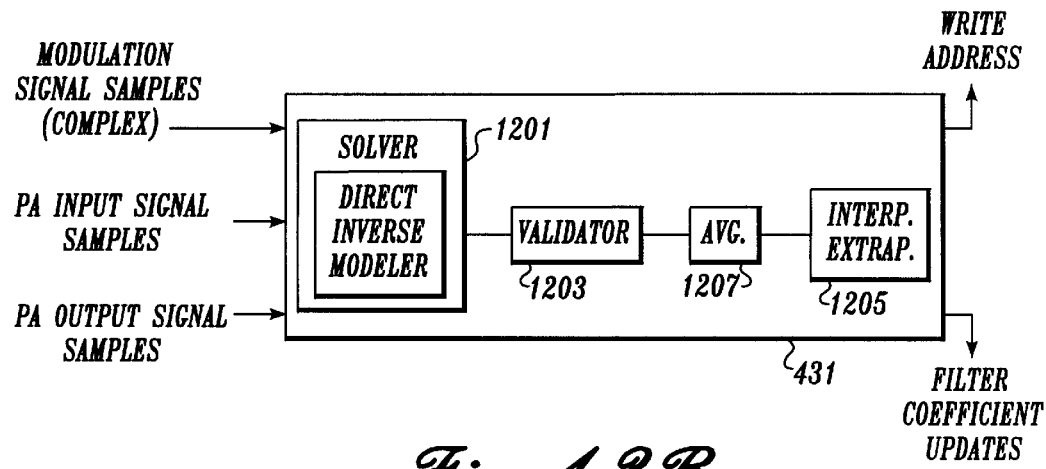

FIG. 12B is a functional block diagram of yet another embodiment of the trainer 431. This embodiment is substantially similar to the embodiment of FIG. 12A except that the averager 1207 is connected between the solver 1201 and the interpolator/extrapolator 1205. Thus, the calculated parameters are averaged with the stored parameters before the interpolation/extrapolation process. The operation of this embodiment is described further below in conjunction with FIG. 13B.

Figure 13:
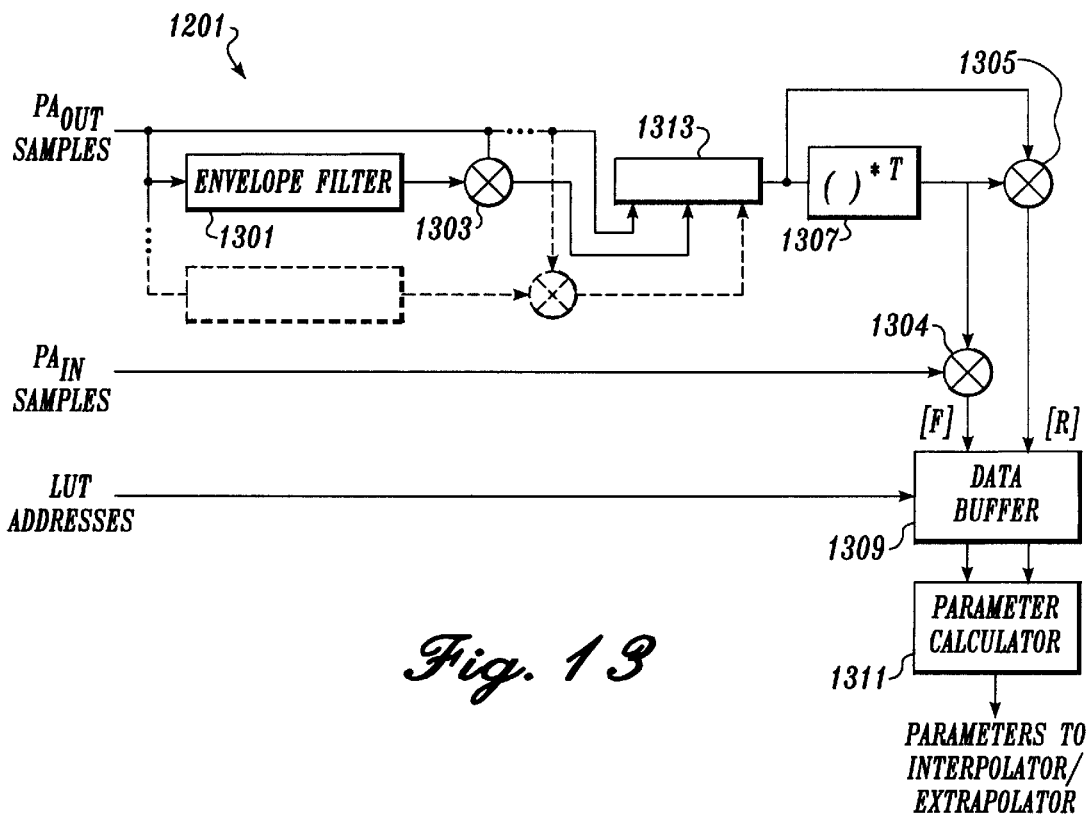
FIG. 13 is a functional block diagram of the solver depicted in the trainer of FIG. 12, according to one embodiment of the present invention.

FIG. 13 is a functional block diagram of the solver 1201 (FIG. 12). The solver 1201 includes an envelope filter 1301, multipliers 1303, 1304, and 1305, a matrix transposer 1307, a data buffer 1309 and a parameter calculator 1311. These functions are implemented in the TMS320C44 DSP microprocessor and associated memory of the trainer 431 (FIG. 7). The solver 1201 receives the $PA_{in}$ samples and $PA_{out}$ samples and the addresses corresponding to these samples in the predistorter's LUT derived from the modulation signal samples. Considering the process which takes place in the solver 1201 on a sample by sample basis, the envelope filter 1301 filters each $PA_{out}$ sample and provides a scalar output sample as a function of previous $PA_{out}$ samples to the multiplier 1303. In this embodiment, the envelope filter 1301 is implemented in the same manner as the envelope filter 900 FIG. 9 or other versions depicted in FIGS. 9A, 10 or 10A) of the predistorter. Consequently, the memory effects of the $PA_{out}$ samples are determined in the same manner as in the predistorter.

The multiplier 1303 then multiplies each $PA_{out}$ sample with the corresponding scalar output signal of the envelope filter 1301. This product and the $PA_{out}$ sample are then formatted or ordered into a row vector, as indicated by the block 1313. The matrix transposer 1307 then transposes and performs a complex conjugation of the row vector, thereby forming a column vector. The multiplier 1304 then multiplies this column vector with the corresponding $PA_{in}$ sample, resulting in a column vector The column vector F is stored in the data buffer 1309 along with the corresponding predistorter LUT address for the $PA_{out}$ sample. Similarly, the multiplier 1305 then multiplies the row matrix from the block 1313 with the column matrix from the matrix transposer 1307, resulting in a two-by-two square matrix R, which is also stored in the data buffer 1309 along with the corresponding predistorter LUT address.

The parameter calculator 1311 then accesses the data in the data buffer 1309 to calculate the values of the complex parameters serving as a basis for updating the predistorter LUT. The parameters are processed by the validator 1203, interpolator/extrapolator 1205 and averager 1207 of the trainer 431 (FIG. 12) to generate the values for updating the predistorter LUT, as described further below in conjunction with FIG. 13A.

In alternative embodiments, additional envelope filters and multipliers may be included in the solver 1201 (as indicated in dashed lines in FIG. 13) to implement other memory effect modeling algorithms. Each additional envelope filter adds another column to the row vector provided by the block 1313, as well as another column and row to the square matrix R generated by the multiplier 1305. For example, addition of one additional envelope filter would cause the row vector from the block 1313 to have three columns and the matrix R to be a three-by-three square matrix. The solver 1201 then uses substantially the same algorithms as for the two-level memory effect model to process this increased amount of data with, of course, an increase in the processing time for each block of data.

Figure 13A:
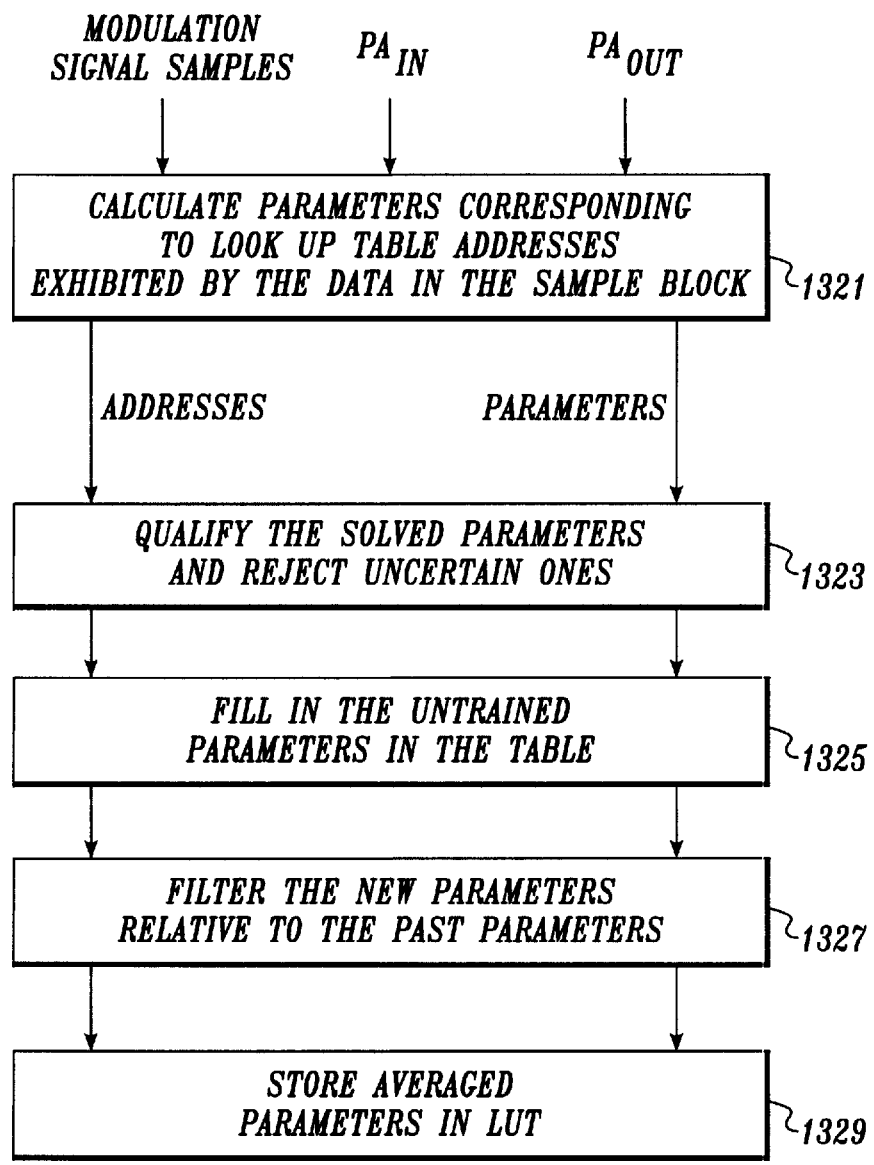
FIGS. 13A and 13B are flow diagrams illustrating the operation of the solver according to two embodiments of the present invention.

FIG. 13A is a flow diagram illustrating the process of determining complex parameters for updating the predistorter LUT, according to one embodiment of the present invention. Referring to FIGS. 12, 13 and 13A, the solver 1201 calculates complex "inverse" parameters corresponding to the predistorter LUT addresses, as indicated by a block 1321 in the flow chart of FIG. 13A. In particular, the solver 1201 receives a block of synchronized modulation signal samples, $PA_{in}$ samples, $PA_{out}$ samples and LUT addresses. As described above in conjunction with FIG. 12, these samples are quantized into bins corresponding to LUT addresses. The samples may also be interpolated to increase their numbers as described in conjunction with FIG. 12. The solver 1201 calculates complex parameters by forming the F and R matrices for each table bin as described above in conjunction with FIG. 13 to implement a pseudo-linear least squares technique. The F and R matrices are derived and applied to equation 1:

$$RP = F \quad (1)$$

where P is a vector of the complex inverse parameters. Equation 1 is then solved for P using standard linear algebra techniques (e.g., Cramer's Rule).

More specifically, for each bin, the block 1313 orders the received complex $PA_{out}$ samples and the output sample from the multiplier 1303 (i.e., the product of the $PA_{out}$ samples and the output samples from the envelope filter 1301) and forms a row vector. The matrix transposer 1307 both complex conjugates and transposes the row vector from the block 1313 into a column vector of complex conjugates. The multiplier 1305 then multiplies these column and row vectors to form the two-by-two matrix R. The matrix R is the accumulation of the products generated by the multiplier 1305 for the current batch (i.e., for each bin, the product generated by the multiplier 1305 is added to the previous values of the matrix R generated from the data of the current batch). The elements of the matrix R for the j-th bin are summarized in Table 1 below.

TABLE 1

$$r_{11} = \sum_{i=1}^{Nj} PAoutpower_i \quad r_{12} = \sum_{i=1}^{Nj} (ENVfilterout_i \cdot PAoutpower_i)$$

$$r_{21} = R_{12} \quad\quad r_{22} = \sum_{i=1}^{Nj} ((ENVfilterout_i)^2 \cdot PAoutpower_i)$$

The term $ENVfilterout_i$ is used to denote the scalar output sample of the envelope filter 1301 (e.g., see FIG. 9 for an FIR digital filter implementation for the envelope filter 1301) corresponding to the i-th $PA_{out}$ sample, with $N_j$ being the number of samples in the j-th bin. The term $PAoutpower_i$ is the power of the i-th $PA_{out}$ sample, as defined in equation 2 below.

$$PAoutpower_i = PAoutI_i^2 + PAoutQ_i^2 \quad (2)$$

where $PAoutI_i$ and $PAoutQ_i$ are the I and Q components of the i-th $PA_{out}$ sample, respectively.

In addition, for each bin, the multiplier 1304 then multiplies the $PA_{in}$ samples with the column vector from the matrix transposer 1307 to form the column vector matrix F. The elements of the column vector F for the j-th bin are set forth in Table 2 below.

TABLE 2

$$f_{1_I} = \sum_{i=1}^{Nj} (PAoutI_i \cdot PAinI_i + PAoutQ_i \cdot PAinQ_i)$$

$$f_{1_Q} = \sum_{i=1}^{Nj} (PAoutI_i \cdot PAinQ_i + PAoutQ_i \cdot PAinI_i)$$

$$f_{2_I} = \sum_{i=1}^{Nj} (ENVfilterout_i \cdot f_{1_I})$$

$$f_{2_Q} = \sum_{i=1}^{Nj} (ENVfilterout_i \cdot f_{1_Q})$$

The complex parameters representing the inverse characteristics that are stored in the predistorter LUT are then calculated as set forth in Table 3 below for each LUT address. Table 3 summarizes the solution for vector P in equation 1. As described above in conjunction with FIG. 7, the predistorter LUT has a complex gain for the current instantaneous power envelope (i.e., corresponding to the static branch of the predistorter filter) and a complex gain for the average power envelopes of previous samples (i.e., corresponding to the weighted branch of the predistortion filter).

TABLE 3

$$static_I = \frac{f_{1_I} \cdot r_{22} - f_{2_I} \cdot r_{12}}{detR} \quad static_Q = \frac{f_{1_Q} \cdot r_{22} - f_{2_Q} \cdot r_{12}}{detR}$$

$$weighted_I = \frac{f_{2_I} \cdot r_{11} - f_{1_I} \cdot r_{21}}{detR} \quad weighted_Q = \frac{f_{2_Q} \cdot r_{11} - f_{1_Q} \cdot r_{21}}{detR}$$

The term det R is used in Table 3 to denote the determinant of the matrix R. Then in a step 1323, the validator 1203 empties the bins having parameters that are unreliable (e.g., outside of predetermined limits or are statistically too varying) or are generated from too few samples.

In cases where the values in a particular bin are considered undesirable for training as defined by the validator, the following alternative method may be used to derive some values for training. The weighted values are calculated using interpolation of past weighted values. In addition, the static values are calculated using equations 3 and 4 below for each set of corresponding samples $PA_{out}$ and $PA_{in}$:

$$static_I = F_I/(PAout_I^2 + PAout_Q^2) \tag{3}$$

$$static_Q = F_Q/(PAout_I^2 + PAout_Q^2) \tag{4}$$

where $PAin_I$, $PAin_Q$, $PAout_I$ and $PAout_Q$ respectively represent the average of the I and Q components of the $PA_{in}$ and $PA_{out}$ samples of the emptied bin, and where $F_I$ and $F_Q$ are defined by equations 5 and 6 below.

$$F_I = (PAout_I)(PAin_I) + (PAout_Q)(PAin_Q) \tag{5}$$

$$F_Q = (PAout_I)(PAin_Q) - (PAout_Q)(PAin_I) \tag{6}$$

Alternatively, the static values can be calculated from the previously trained weighted values using a technique referred to herein as a slip-back technique. In this embodiment, the slip back technique calculates the static value of an emptied bin using the equations:

$$static_I = \frac{f_{1_I} - (r_{12} \cdot PreviousWeighted_I)}{r_{11}} \tag{7}$$

$$static_Q = \frac{f_{1_Q} - (r_{12} \cdot PreviousWeighted_Q)}{r_{11}} \tag{8}$$

where $PreviousWeighted_I$ and $PreviousWeighted_Q$ are the I and Q components of the previous trained and weighted value (see table 3) of the bin. This technique advantageously simplifies the calculation of the static values because the previously trained weighted values are already known.

In a next step 1325, the interpolator/extrapolator 1205 fills in the emptied bins by interpolation or extrapolation from other surrounding bins which were trained. A simple linear interpolation or extrapolation between the nearest bins that passed validation can be performed, but in a preferred embodiment, the interpolation and extrapolation is performed using standard curve fitting techniques that take into account the whole range of values that passed the validation process. These calculated values can then be used directly to update the parameters in the predistorter LUT. However, in a preferred embodiment, a next step 1327 is performed in which the averager 1207 finds a weighted average of these new parameters and the current parameters. Typically, the averaging is done so that the more weight is given to the most recent parameters. These weighted averages are then used to update the predistorter LUT.

Figure 13B:
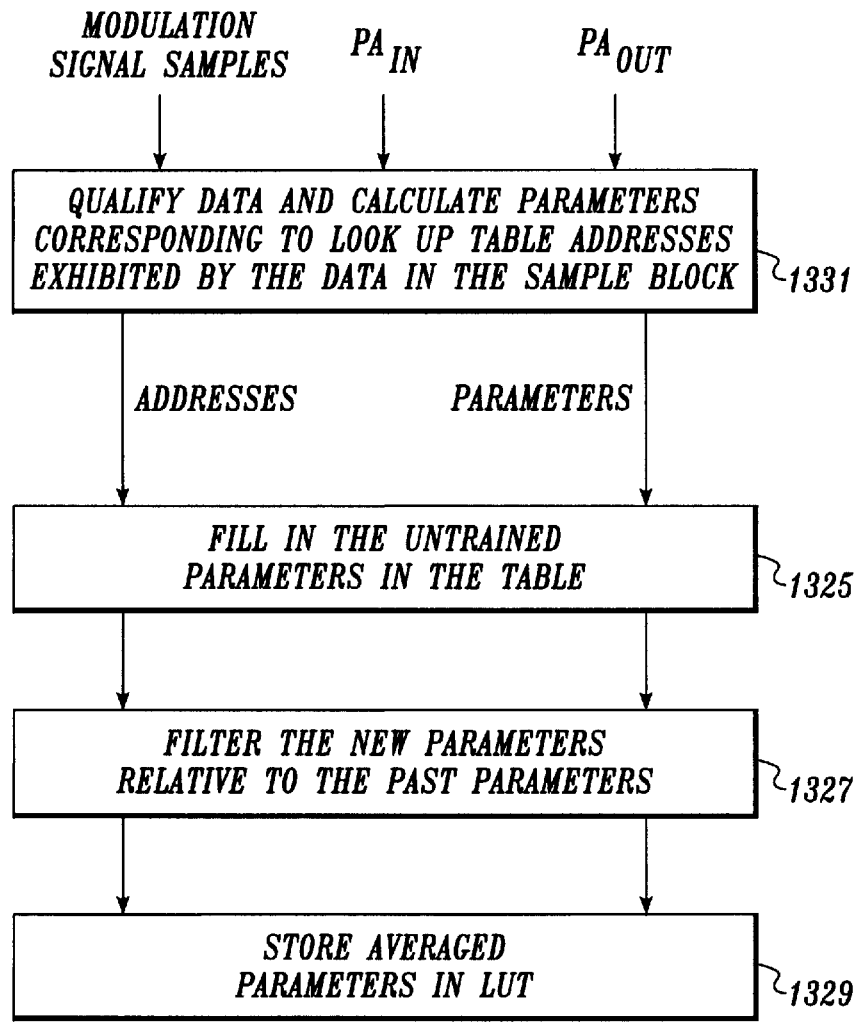

FIG. 13B is a flow diagram illustrating the process of determining complex parameters for updating the predistorter LUT, according to another embodiment of the present invention. This embodiment is substantially similar to the embodiment described in conjunction with FIG. 13A except that the validation process is performed prior to calculation of the parameters. In particular, in an initial step 1331, the solver receives a block of synchronized modulation signal samples, $PA_{in}$ samples, $PA_{out}$ samples and LUT addresses as in the step 1321 (FIG. 13A). Before calculating the complex data for each table bin, the validator qualifies the parameter in a manner similar to the validator 1203 (FIG. 12A). For example, the standard deviation of the samples in a bin can be calculated and if exceeding a predetermined threshold, the bin is emptied. If the data is unreliable, the calculation process for that particular bin is not done, thereby reducing the trainer processing time. The process then proceeds to the steps 1325, 1327 and 1329 as described above in conjunction with FIG. 13A.

In still another embodiment, the step 1327 may be performed before the step 1325. That is, the calculated parameter values may be averaged with the corresponding current (or, alternatively, a running weighted average of past) predistorter LUT parameters before empty bins are interpolated or extrapolated. Accordingly, averaging only takes place with calculated parameters that have passed the validation process.

Figure 14:
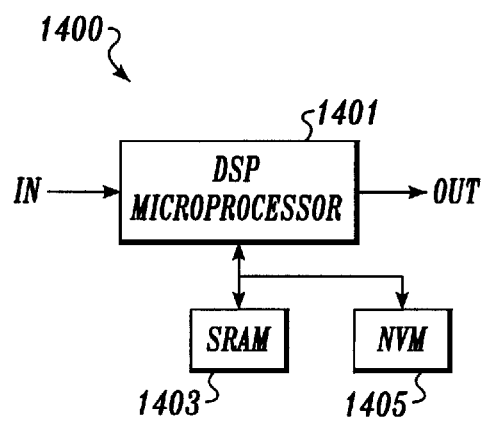
FIG. 14 is a block diagram of digital signal processing circuit for implementing a predistorter and trainer, according to one embodiment of the present invention.

FIG. 14 is a block diagram of a DSP module 1400 for implementing a predistorter and trainer, according to one embodiment of the present invention. The DSP module 1400 is substantially similar to the DSP module disclosed in the aforementioned U.S. Pat. No. 5,732,333, but a brief description is included herein for completeness. The DSP module 1400 includes a microprocessor 1401, a static random access memory (SRAM) 1403 and a nonvolatile memory (NVM) 1405. In a preferred embodiment, the microprocessor 1401 is a DSP microprocessor TMS320C44 available from Texas Instruments, although any suitable microprocessor can be used. The microprocessor 1401 is connected to the SRAM 1403 and the NVM 1405. In this embodiment, the NVM 1405 is implemented using a flash electrically programmable read only memory (EPROM). As a result, the DSP module 1400 can be configured or programmed for a variety of functions, such as, for example, forming part of a modulator, interpolator, trainer or predistorter. Further, the DSP module 1400 can be reprogrammed to change its functionality by replacing the configuration program stored in the nonvolatile memory 1405.

Further, when implementing the predistorter with a DSP module 400, the predistorter can, on powerdown, store the predistortion values in the nonvolatile memory 405. As a result, the predistorter can use these stored values immediately after power up to predistort data to be transmitted. Thus, the predistorter does not require a special initialization process with special training sequences as required in many conventional systems.

Additionally, the DSP module in the modulator 403 (FIG. 4) can be programmed to scale the in-phase and quadrature output signals at start-up and powerdown to "ramp" the input signals to the power amplifier using a look up table (LUT) containing a smooth ramping function of multiplier factors, thereby reducing transients in the power supply voltages and spurious output signal from the power amplifier. In a preferred embodiment, a Gaussian scaling is used. Smooth ramping can be individually applied to individual subcarriers when more than one is transmitted simultaneously.

Further, it has been found that intermodulation products and other distortion (collectively known as "distortion") located in the desired broadcast RF channel (referred to as "in-band") adversely affects the training of the predistorter. The in-band distortion is not only generated by the non-linearity of the power amplifier, but also from other low frequency sources that are not necessarily from the power amplifier. Sources of these non-power amplifier distortions may include any combination of dynamic power supply effects including ripple and transient noise. In addition, bias irregularities on the power amplifier transistors and thermal transients can introduce low frequency (in-band) effects that are not a reproducible part of the distortion and which is not helpful to model and predistort.

Further, the low frequency distortions appear close to the center of the band when upconverted to the power amplifier output frequency. If these distortions are not due to the power amplifier, then modeling of these distortions and applying their inverses to the power amplifier will not necessarily help. Thus, in an alternative embodiment, the present invention solves this problem by removing the in-band distortion from the power amplifier output signal that is used by the trainer.

Figure 15:
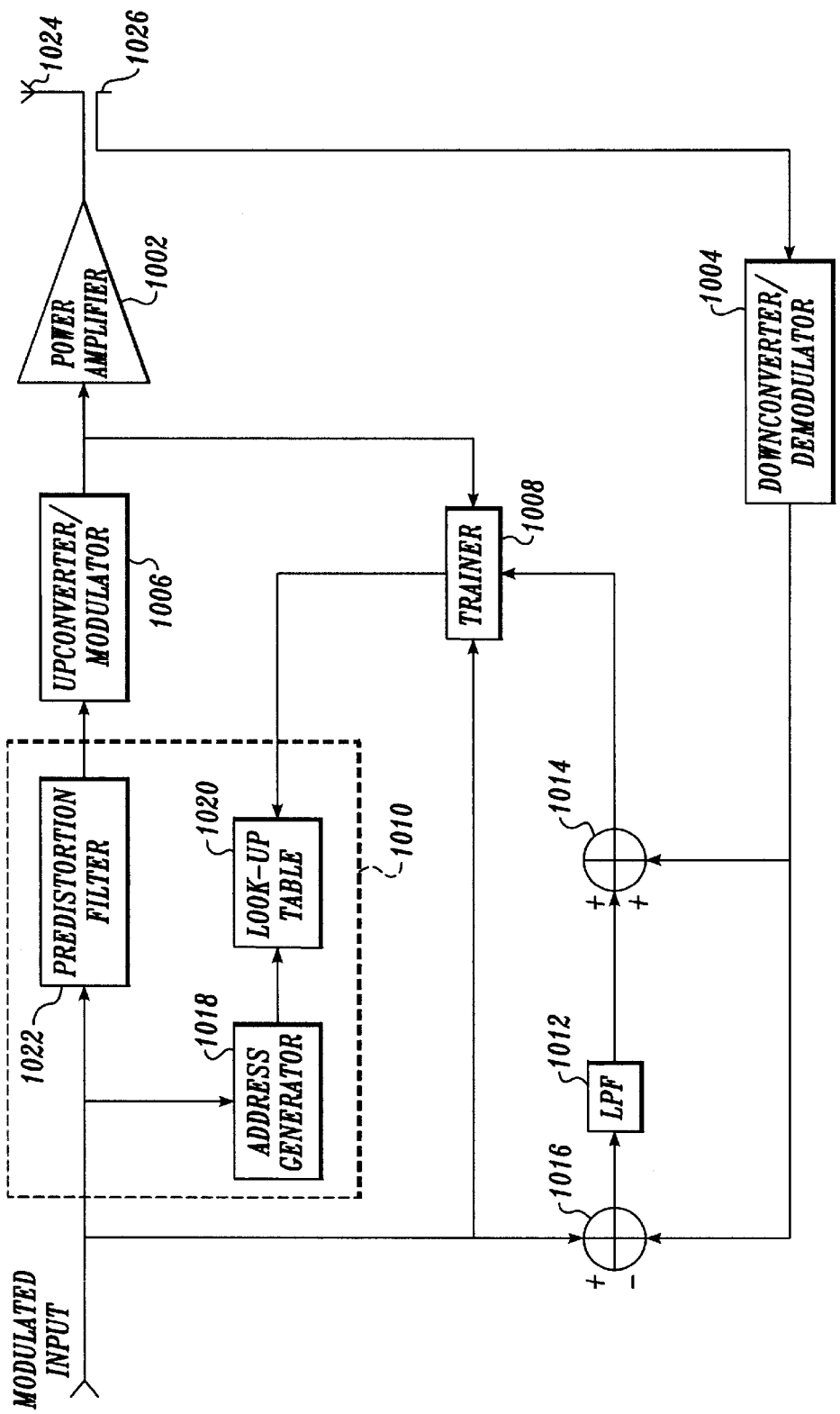
FIG. 15 is a block diagram of an alternative embodiment of the present invention.

Specifically, turning now to FIG. 15, a block diagram of an alternative embodiment of the present invention is shown. The block diagram is similar to that shown in the preferred embodiment except for additional components adapted to remove the in-band distortion from the power amplifier output. The transmitter 1000 includes a power amplifier 1002, a downconverter/demodulator 1004, an upconverter/modulator 1006, a trainer 1008, a predistorter 1010, a low-pass filter (LPF) 1012, first summer 1016 and second summer 1014, broadcast antenna 1024, and directional coupler 1026.

In operation, the modulated input is provided to the predistorter 1010. The predistorter is preferably comprised of an address generator 1018, a look up table 1020, and a non-linear predistortion filter 1022. These elements of the predistorter 1010 are detailed above. The modulated input is a digital complex baseband signal including in-phase (I) and quadrature (Q) components. The predistorter 1010 is operative to filter the modulated input so as to "predistort" the modulated input. The output of the predistorter 1010 is provided to the upconverter/modulator 1006. The function of the upconverter/modulator 1006 is twofold. First, the upconverter/modulator 1006 acts to combine the in-phase (I) and quadrature (Q) components of the modulated input. Second, the upconverter/modulator 1006 acts to increase the frequency of the signal to the desired broadcast RF channel. Further, the upconverter 1006 also includes a digital to analog converter for converting the digital signal output by predistorter 1010 into an analog signal for transmission. The output of the upconverter 1006 is then provided to power amplifier 1002 for amplification and broadcast by broadcast antenna 1024.

Directional coupler 1026 monitors the output of the power amplifier 1002 by monitoring the signal transmitted by broadcast antenna 1024. The output of the power amplifier 1002 is then input into downconverter/demodulator 1004. The downconverter/demodulator 1004 performs exactly the opposite function as the upconverter/modulator 1006. Namely, the downconverter/demodulator 1004 acts to first decrease the frequency of the received signal from the desired broadcast RE channel. It is important that upconverter/modulator 1006 and downconverter/demodulator 1004 be precisely matched to each other in terms of frequency conversion. In other words, the frequency of the output of the downconverter/demodulator 1004 should be substantially the same as the frequency of the input of the upconverter/modulator 1006.

Next, the downconverter/demodulator 1004 also includes an analog to digital converter for converting the analog received signal into a digital signal. Finally, the downconverter/demodulator 1004 acts to demodulate the digital signal into a digital complex baseband signal having in-phase (I) and quadrature (Q) components.

The output of the downconverter/demodulator 1004 is then provided as an input to the first summer 1016 and the second summer 1014. Another input of the first summer 1016 is the modulated input. First summer 1016 is operative to subtract the output of downconverter/demodulator 1004 from the modulated input to form an error signal. Because the output of the downconverter/demodulator 1004 (derived from the output of the power amplifier 1002) is subtracted from the modulated input, the error signal is the negative of the distortion caused by the power amplifier 1002.

The error signal is provided to LPF 1012. In the preferred embodiment, LPF 1012 has a cutoff frequency of 24 kHz. However, it can be appreciated by those skilled in the art that the cutoff frequency may be adjusted depending upon the bandwidth of the desired broadcast RF channel. The function of LPF 1012 is to remove that part of the error signal that is outside of the desired broadcast RF channel (referred to as "out-of-band"). The output of LPF 1012 is referred to as the in-band error signal. The in-band error signal is the negative of the in-band distortion caused by power amplifier 1002.

Next, the in-band error signal is added to the output of the downconverter/demodulator 1004 at second summer 1014. This has the effect of subtracting the in-band distortion from the output of the downconverter/demodulator 1004. The output of the second summer 1014 is referred to as the modified power amplifier output signal. The modified power amplifier output signal is then used by the trainer 1008 (as discussed above) to calculate the values stored in look up table 1020 of predistorter 1022. Thus, the modified power amplifier output replaces the power amplifier output shown in FIG. 6.

Further, as in the preferred embodiment, the modulated input is provided directly as an input to trainer 1008. Also as in the preferred embodiment, the trainer has a third input that is the input signal to the power amplifier 1002. Thus, the trainer 1008 has three inputs: the modified power amplifier output signal, the modulated input, and the input to the power amplifier. Each of these three inputs are acted upon by the trainer 1008 in accordance with the description above to generate numeric values that provided to look up table 1020 for use by the predistorter 1010.

The embodiments of the predistortion system described above are illustrative of the principles of the present invention and are not intended to limit the invention to the particular embodiments described. Accordingly, while the preferred embodiment of the invention has been illustrated and described, it will be appreciated that in light of the present disclosure, various changes can be made to the described embodiments without departing from the spirit and scope of the invention.

The embodiments of the invention in which an exclusive property or privilege is claimed are defined as follows:

1. A method for compensating for distortion caused by a power amplifier in a radio frequency (RF) transmitter, the method comprising:
    determining an inverse transfer characteristic of the power amplifier as a function of a current signal sample and of a previous signal sample outputted by the RF transmitter, said current signal sample and said previous signal sample having their in-band distortion removed; and
    applying said inverse transfer characteristic to a modulation signal sample to be amplified by the power amplifier to form a predistorted signal sample, wherein said inverse transfer characteristic compensates for distortion caused by the power amplifier when said power amplifier amplifies a signal dependent on said predistorted signal sample.

2. The method of claim 1 wherein said inverse transfer characteristic is a function of a magnitude of said current signal sample and an average of previous signal sample magnitudes.

3. The method of claim 1 wherein said inverse transfer characteristic is a function of a power of said current signal sample and an average of previous signal sample powers.

4. The method of claim 3 wherein said inverse transfer characteristic includes a first complex gain and a second complex gain, said predistorted signal sample being dependent on a sum of a static gain sample and a weighted gain sample, said static gain sample being dependent on a product of said current signal sample and said first complex gain, said weighted gain sample being dependent on a product of said average of previous signal sample powers and said second complex gain.

5. The method of Claim 4 wherein said first and second complex gains are stored in a table at an address corresponding to said instantaneous power envelope of said current signal sample.

6. The method of claim 5 wherein said table stores an inverse transfer characteristic at each address of said table, each said address having a corresponding predetermined range of power, wherein each signal sample received by the RF transmitter is predistorted by applying to each signal sample the inverse transfer characteristic stored in said table at an address corresponding to each signal sample's instantaneous power envelope.

7. A method for determining a transfer characteristic for compensating for distortion caused by a power amplifier, the method comprising:
    storing a plurality of modulation signal samples to be amplified by the power amplifier;
    storing a plurality of predistorted signal samples, wherein each modulation signal sample of said plurality of modulation signal samples has a corresponding predistorted signal sample of said plurality of predistorted signal samples;
    sampling a signal that depends on an output signal of the power amplifier to obtain a plurality of output signal samples, wherein each predistorted signal sample of said plurality of signal samples has a corresponding output signal sample of said plurality of output signal samples;
    removing the in-band distortion from said plurality of output signal samples to form a plurality of modified output signal samples;
    storing said plurality of modified output signal samples;
    determining an inverse transfer characteristic of the power amplifier for each modified output signal sample as a function of the modified output signal sample and a previous modified output signal sample, wherein each inverse transfer characteristic includes a first complex gain and a second complex gain, said first complex gain representing a gain of a level of the modified output signal sample to a level of the corresponding modulation signal sample, said second complex gain representing a gain of an average of the levels of the modified output signal sample and the previous modified output signal sample to an average of the levels of the corresponding modulation signal sample and corresponding previous modulation signal sample, whereby a plurality of inverse transfer characteristics are determined;
    quantizing said plurality inverse transfer characteristics into a plurality of bins, each bin of said plurality of bins being mapped to a corresponding address of a table;
    for each bin of said plurality of bins, averaging any inverse transfer characteristics within each bin; and
    storing at each address of said table a predistortion gain, each predistortion gain being a function of the inverse transfer characteristic of the bin corresponding to the predistortion gain's address.

8. The method of claim 7 further comprising:
    emptying one or more bins of said plurality of bins that have an average inverse transfer characteristic outside of a predetermined range; and
    filling an emptied bin with an inverse transfer characteristic interpolated from adjacent bins.

9. The method of claim 7 further comprising:
    emptying one or more bins of said plurality of bins that have an average inverse transfer characteristic outside of a predetermined range; and
    filling an emptied bin with an inverse transfer characteristic extrapolated from adjacent bins.

10. The method of claim 7 wherein storing at each address of said table a predistortion gain further compromises updating said table, wherein each address of said table is updated with an updated predistortion gain determined as an average of a current predistortion gain stored at that address and an inverse transfer characteristic from a bin corresponding to that address.

11. The method of Claim 10 wherein said updated predistortion gain for each address is determined as a weighted average of a current predistortion gain stored at that address and an inverse transfer characteristic from a bin corresponding to that address.

12. The method of Claim 7 wherein determining an inverse transfer characteristic as a function of a current signal sample and a previous signal sample for each modified output signal sample, further comprises:

filtering said plurality of modified output signal samples using an envelope filter, said envelope filter providing a plurality of envelope filter output samples, wherein each envelope filter output sample represents an average of a level of a received modified output signal sample and one or more previous modified output signal sample levels;

for each modified output signal sample, multiplying each envelope filter output sample with the modified output signal sample received by said envelope filter to obtain a weighted modified output signal sample;

for each modified output signal sample, forming a row vector with the modified output signal sample received by said envelope filter and the corresponding weighted modified output signal sample;

for each row vector, transposing and complex conjugating said row vector to form a column vector;

for each column vector and corresponding row vector, multiplying said column vector and said row vector to form a corresponding R-matrix;

for each column vector, multiplying said column vector with the corresponding signal sample to form a corresponding F-column vector;

for each address in said table, accumulating R-matrices determined for each modified output signal sample corresponding to that address; and for each address in said table, accumulating F-column vectors determined for each modified output signal sample corresponding to that address, wherein for each address in said table, the corresponding pair inverse transfer characteristic is dependent on the corresponding accumulated R-matrices and corresponding accumulated F-column vectors.

13. The method of claim 12 wherein said levels are powers.

14. The method of claim 12 wherein said levels are magnitudes.

15. The method of claim 12 wherein the inverse transfer characteristic corresponding to each address of said table depends on a relationship in which a product of the corresponding accumulated R-matrices and the inverse transfer characteristic equals the corresponding F-column vector.

16. The method of claim 15 wherein each inverse transfer characteristic is determined by applying Cramer's rule to the corresponding accumulated R-matrices and F-column vectors to solve for the inverse transfer characteristic.

17. An apparatus for compensating for distortion caused by a power amplifier in a radio frequency (RF) transmitter, the apparatus comprising:

means for determining an inverse gain of the distortion caused by the power amplifier as a function of a current signal sample and of a previous signal sample received by the RF transmitter, said current signal sample and said previous signal sample having their in-band distortion removed; and means for applying said inverse gain to said current sample to form a predistorted signal sample, wherein said inverse gain compensates for distortion caused by the power amplifier when said power amplifier amplifies a signal dependent on said predistorted signal sample.

18. An apparatus for determining a gain for compensating for distortion caused by a power amplifier, the apparatus comprising:

a buffer;

means for storing a plurality of modulation signal samples to be amplified by the power amplifier in the buffer;

means for storing a plurality of predistorted signal samples in the buffer, wherein each modulation signal sample of said plurality of modulation signal samples has a corresponding predistorted signal sample of said plurality of predistorted signal samples;

sampling means for sampling a signal that depends on an output signal of the power amplifier to obtain a plurality of output signal samples, wherein each predistorted signal sample of said plurality of predistorted signal samples has a corresponding output signal sample of said plurality of output signal samples, said sampling means storing said plurality of output signal samples in the buffer;

means for removing the in-band distortion from said plurality of output signal samples to form a plurality of modified output signal samples;

means for determining an inverse transfer characteristic of the power amplifier for each modified output signal sample as a function of the modified output signal sample and a previous modified output signal sample, wherein each inverse transfer characteristic includes a first complex gain and a second complex gain, said first complex gain representing a gain of the modified output signal sample's power to the corresponding modulation signal sample's power, second complex gain representing a gain of an average of the powers of the modified output signal sample and the previous modified output signal sample to an average of the powers of the corresponding modulation signal sample and corresponding previous modulation signal sample, whereby a plurality of inverse transfer characteristics are determined;

a quantizer coupled to the buffer, wherein said quantizer is configured to quantize said plurality of inverse transfer characteristics inverse into a plurality of bins, each bin of said plurality of bins being mapped to a corresponding address of a table;

an averager coupled to the buffer, wherein for each bin of said plurality of bins, said averager is configured to average any inverse transfer characteristics within each bin; and means for storing at each address of said table a predistortion gain, each predistortion gain being a function of the inverse transfer characteristic of the bin corresponding to the predistortion gain's address.

19. A system for compensating for distortion caused by a power amplifier in a radio frequency (RF) transmitter, the system comprising:

a predistorter coupled to said power amplifier, wherein said predistorter is configured to apply an inverse gain to a modulation signal as a function of a modulation signal level of the modulation signal and of a modulation signal level of a previous modulation signal, wherein said modulation signal is modulated according to a first modulation scheme; and a trainer coupled to said predistorter and said power amplifier, wherein said trainer is configured to provide inverse gains to said predistorter, said inverse gains being a function of a level of a power amplifier output signal and of a previous power amplifier output signal level, wherein said power amplifier output signal and said previous power amplifier output signal level have their in-band distortion removed, further wherein said inverse gains compensate for distortion caused by the power amplifier.

20. The system of claim 19 wherein said levels are powers.

21. The system of claim 19 wherein said levels are magnitudes.

* * * * *